US009983799B2

(12) United States Patent
Yeh

(10) Patent No.: US 9,983,799 B2
(45) Date of Patent: May 29, 2018

(54) TRIM COMMAND PROCESSING METHOD, MEMORY CONTROL CIRCUIT UNIT AND MEMORY STORAGE APPARATUS

(71) Applicant: PHISON ELECTRONICS CORP., Miaoli (TW)

(72) Inventor: Chih-Kang Yeh, Kinmen County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 81 days.

(21) Appl. No.: 15/186,549

(22) Filed: Jun. 20, 2016

(65) Prior Publication Data

US 2017/0322727 A1 Nov. 9, 2017

(30) Foreign Application Priority Data

May 4, 2016 (TW) .............................. 105113792 A

(51) Int. Cl.
*G06F 12/00* (2006.01)
*G06F 3/06* (2006.01)

(52) U.S. Cl.
CPC ............ *G06F 3/061* (2013.01); *G06F 3/0659* (2013.01); *G06F 3/0688* (2013.01)

(58) Field of Classification Search
CPC ....... G06F 3/061; G06F 3/0688; G06F 3/0659
See application file for complete search history.

(56) References Cited

U.S. PATENT DOCUMENTS

| 2012/0268991 A1* | 10/2012 | Chiao | ................. | G11C 16/349 365/185.11 |
|---|---|---|---|---|
| 2014/0095767 A1* | 4/2014 | Trika | ................. | G06F 12/0238 711/103 |
| 2014/0136768 A1 | 5/2014 | Iglesia | | |
| 2016/0077968 A1* | 3/2016 | Sela | .................... | G06F 12/0246 711/118 |

OTHER PUBLICATIONS

"Office Action of Taiwan Counterpart Application," dated Aug. 2, 2017, p. 1-p. 7.

* cited by examiner

*Primary Examiner* — Gurtej Bansal
(74) *Attorney, Agent, or Firm* — JCIPRNET

(57) ABSTRACT

A trim command processing method for a memory storage apparatus having a rewritable non-volatile memory module having a plurality of physical programming units is provided. The method includes receiving a command from a host system; starting a trim operation to perform an operation corresponding to a trim command according to a record related to the trim command in a trim table if an operation corresponding the command is performed on the rewritable non-volatile memory module with a first mode; and not starting aforesaid trim operation if the operation corresponding the command is performed on the rewritable non-volatile memory module with a second mode.

24 Claims, 25 Drawing Sheets

| Lower physical programming unit | Center physical programming unit | Upper physical programming unit |
|---|---|---|
| 0 | 1 | 2 |
| 3 | 4 | 5 |
| 6 | 7 | 8 |
| 9 | 10 | 11 |
| 12 | 13 | 14 |
| ⋮ | ⋮ | ⋮ |
| 255 | 256 | 257 |

TRIM COMMAND PROCESSING METHOD, MEMORY CONTROL CIRCUIT UNIT AND MEMORY STORAGE APPARATUS

CROSS-REFERENCE TO RELATED APPLICATION

This application claims the priority benefit of Taiwan application serial no. 105113792, filed on May 4, 2016. The entirety of the above-mentioned patent application is hereby incorporated by reference herein and made a part of this specification.

BACKGROUND

Technical Field

The present invention relates to a trim command processing method, and more particularly, relates to a trim command processing method for a rewritable non-volatile memory module, and a memory control circuit unit and a memory storage apparatus using the same method.

Description of Related Art

The growth of digital cameras, mobile phones, and MP3 players has been rapid in recent years. Consequently, the consumers' demand for storage media has increased tremendously. A rewritable non-volatile memory is one of the most adaptable memories for portable electronic products such as a laptop computer due to its data non-volatility, low power consumption, small volume, non-mechanical structure and high read/write speed. A solid state drive is a memory storage apparatus, which utilizes a flash memory as its storage medium. For these reasons, the flash memory has become an import part of the electronic industries.

A flash memory storage module includes a plurality of physical erasing units, and each of the physical erasing units has a plurality of physical programming units, and data must be written into the physical erasing unit according to a sequence of the physical programming units. Further, the physical programming units already written with data must be erased before they can be used again for writing data. In particular, the physical erasing unit is the minimum unit for erasing, and the physical programming unit is the minimum unit for programming (writing). Further, in a management of the flash memory module, the physical erasing units are divided into a data area and a spare area.

The physical erasing units of the data area are configured to store data stored by a host system. Specifically, a memory control circuit unit in the memory storage apparatus may convert logical addresses to be accessed by the host system into logical addresses of logical blocks, and map the logical addresses of the logical blocks to the physical programming units of the physical erasing units of the data area. In other words, the physical erasing units of the data area are regarded as the physical erasing units already being used (e.g., already stored with data written by the host system) in the management of the flash memory module. For example, the memory control circuit unit may use a logical-to-physical address mapping table to record mapping relations between the logical blocks and the physical erasing units of the data area. The logical addresses in the logical block are corresponding to the physical programming units of the mapped physical erasing unit.

The physical erasing units of the spare area are used for replacing the physical erasing units in the data area. Specifically, as described above, the physical erasing units written with data must be erased before they can be used again for writing data. Therefore, the physical erasing units of the spare area are designed to substitute the physical erasing units mapped to the logical blocks for writing data. Accordingly, the physical erasing units of the spare area are empty or usable physical erasing units (i.e., in which data is not recorded or data is marked as invalid data). In other words, the physical programming units of the physical erasing units in the data area and the spare area are alternatively used for mapping to the logical addresses of the logical blocks in order to store the data written by the host system.

In current flash memory storage technologies, while deleting data in the logical addresses, the host system gives trim commands to inform the memory control circuit unit of which logical addresses in which the data is already deleted. By doing so, during a garbage collection operation (also known as a valid data merging operation), the memory control circuit unit can avoid moving the data already being deleted, so as to improve performance of the flash memory apparatus and extend life time of the flash memory. However, a time required for performing operations corresponding to the trim commands may often result in system time out. Therefore, how to effectively process the trim commands is still one of the major goals to be accomplished by persons skilled in the art.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention is directed to a trim command processing method, a memory control circuit unit and a memory storage apparatus, which are capable of effectively performing operations corresponding to the trim commands.

An exemplary embodiment of the present invention provides a trim command processing method for a memory storage apparatus. The memory storage apparatus has a rewritable non-volatile memory module, and the rewritable non-volatile memory module includes a plurality of physical programming units. The trim command processing method includes: receiving a command from a host system; starting a trim operation to perform at least one operation corresponding to at least one trim command according to a record related to the at least one trim command in a trim table when at least one operation corresponding to the command is performed on the rewritable non-volatile memory module with a first mode; and not starting the trim operation when the at least one operation corresponding to the command is performed on the rewritable non-volatile memory module with a second mode.

An exemplary embodiment of the present invention provides a memory control circuit unit, which includes a host system, a memory interface and a memory management circuit. The host interface is configured to couple to a host system. The memory interface is configured to couple to a rewritable non-volatile memory module, wherein the rewritable non-volatile memory module includes a plurality of physical programming units. The memory management circuit is coupled to the host interface and the memory interface, and configured to receive a command from the host system. The memory management circuit is further configured to start a trim operation to perform an operation corresponding to a trim command according to a record related to the trim command in a trim table when giving a first command sequence configured to perform an operation corresponding to the command on the rewritable non-volatile memory module with a first mode. The memory management circuit is further configured to not start the trim operation when giving a second command sequence configured to perform the operation corresponding to the command on the rewritable non-volatile memory module with a second mode.

An exemplary embodiment of the present invention provides a memory storage apparatus, which includes a connection interface unit, a rewritable non-volatile memory module and a memory control circuit unit. The connection interface unit is configured to couple to a host system. The rewritable non-volatile memory module includes a plurality of physical programming units. The memory control circuit unit is coupled to the connection interface unit and the rewritable non-volatile memory module, and is configured to receive a command from the host system. The memory control circuit unit is further configured to start a trim operation to perform an operation corresponding to a trim command according to a record related to the trim command in a trim table when giving a first command sequence configured to perform an operation corresponding to the command on the rewritable non-volatile memory module with a first mode. The memory control circuit unit is further configured to not start the trim operation when giving a second command sequence configured to perform the operation corresponding to the command on the rewritable non-volatile memory module with a second mode.

Based on the above, the trim command processing method, the memory control circuit unit and the memory storage apparatus according to the exemplary embodiments of the invention are capable of selecting a proper timing for starting the trim operation according to the mode used for performing the operation, so as to improve performance of the memory control circuit unit and extend life time of the rewritable non-volatile memory module.

To make the above features and advantages of the present invention more comprehensible, several embodiments accompanied with drawings are described in detail as follows.

It should be understood, however, that this Summary may not contain all of the aspects and embodiments of the present invention, is not meant to be limiting or restrictive in any manner, and that the present invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
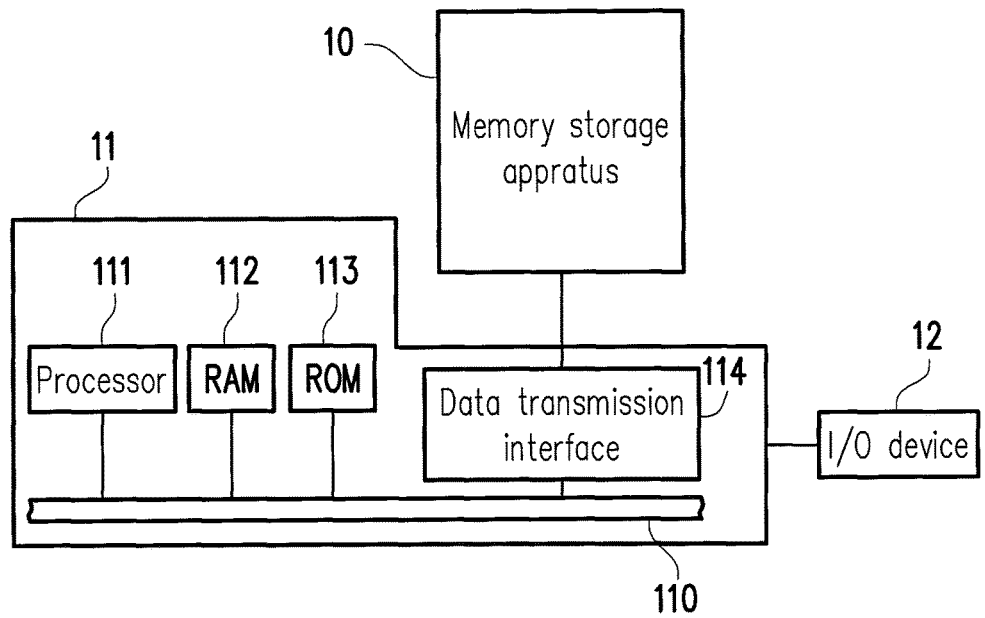
FIG. 1 illustrates a host system and a memory storage apparatus according to an exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage apparatus (also known as a memory storage system) includes a rewritable non-volatile memory module and a controller (also known as a control circuit unit). The memory storage apparatus is usually configured together with a host system so the host system may write data into the memory storage apparatus or read data from the memory storage apparatus.

Figure 2:
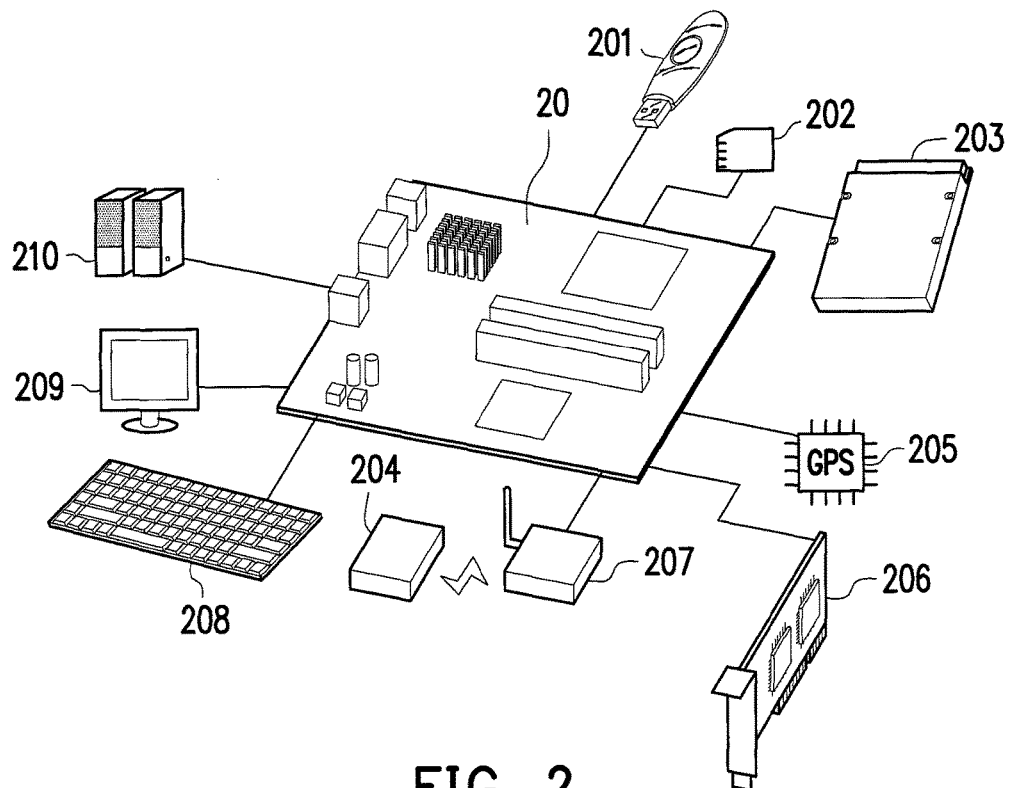
FIG. 2 is a schematic diagram illustrating a computer, an input/output device and a memory storage apparatus according to an exemplary embodiment.

FIG. 1 is a schematic diagram illustrating a host system, a memory storage apparatus and an input/output (I/O) device according to an exemplary embodiment, and FIG. 2 is a schematic diagram illustrating a host system, a memory storage apparatus and an input/output (I/O) device according to another exemplary embodiment.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In the present exemplary embodiment, the host system 11 is coupled to a memory storage apparatus 10 through the data transmission interface 114. For example, the host system 11 can write data into the memory storage apparatus 10 or read data from the memory storage apparatus 10 through the data transmission interface 114. Further, the host system 11 is coupled to an I/O device 12 through the system bus 110. For example, the host system 11 can transmit output signals to the I/O device 12 or receive input signals from I/O device 12 through the system bus 110.

In the present exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage apparatus 10 in a wired manner or a wireless manner. The memory storage apparatus 10 may be, for example, a flash drive 201, a memory card 202, a SSD (Solid State Drive) 203 or a wireless memory storage apparatus 204. The wireless memory storage apparatus 204 may be, for example, a memory storage apparatus based on various wireless communication technologies, such as a NFC (Near Field Communication Storage) memory storage apparatus, a WiFi (Wireless Fidelity) memory storage apparatus, a Bluetooth memory storage apparatus, a BLE (Bluetooth low energy) memory storage apparatus (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 may access the wireless memory storage apparatus 204 through the wireless transmission device 207.

Figure 3:
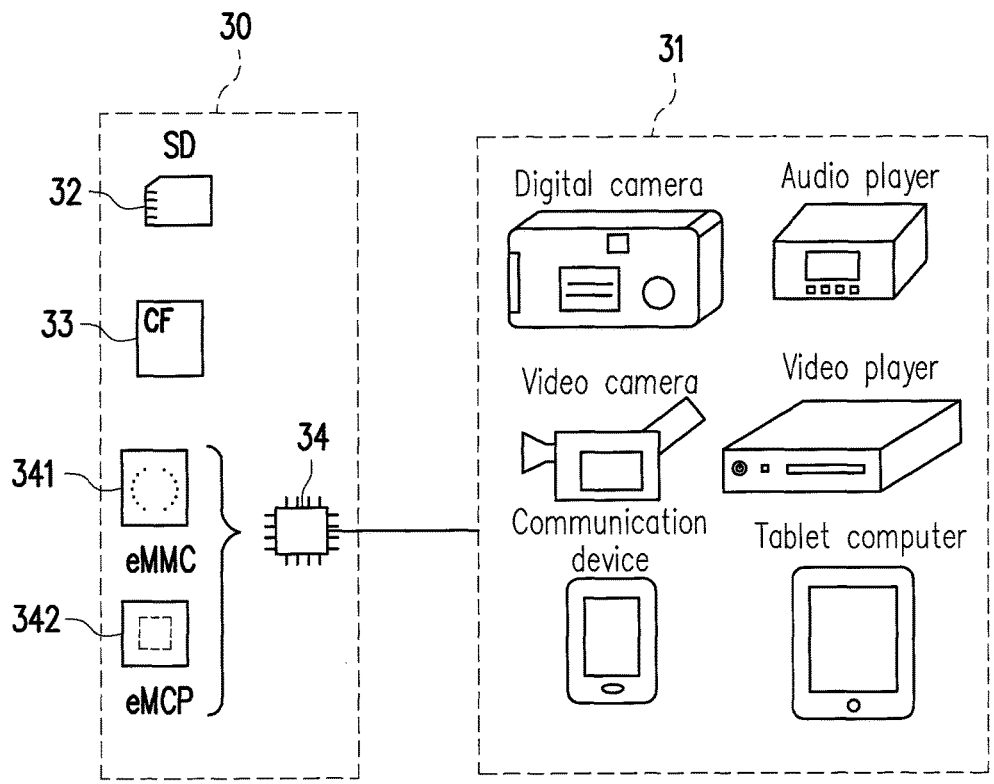
FIG. 3 is a schematic diagram illustrating a host system and a memory storage apparatus according to an exemplary embodiment.

In an exemplary embodiment, aforementioned host system may be any system capable of substantially cooperating with the memory storage apparatus for storing data. Although the host system is illustrated as a computer system in foregoing exemplary embodiment, however, FIG. 3 is a schematic diagram illustrating a host system and a memory storage apparatus according to another exemplary embodiment. Referring to FIG. 3, in another exemplary embodiment, a host system 31 may also be a system including a digital camera, a video camera, a communication device, an audio player, a video player or a tablet computer, whereas a memory storage apparatus 30 may be various non-volatile memory storage apparatuses used by the host system, such as a SD card 32, a CF card 33 or an embedded storage device 34. The embedded storage device 34 includes various embedded storage devices capable of directly coupling a memory module onto a substrate of the host system, such as an eMMC (embedded MMC) 341 and/or an eMCP (embedded Multi Chip Package) 342.

Figure 4:
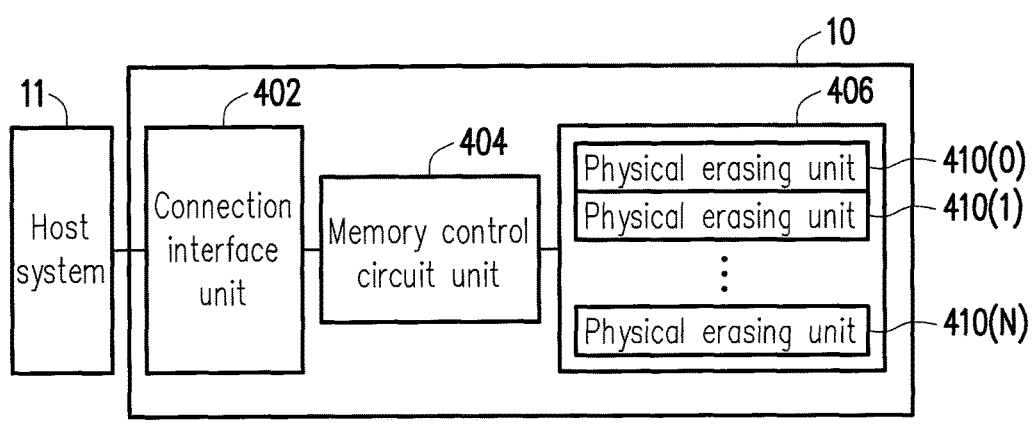
FIG. 4 is a schematic block diagram illustrating a memory storage apparatus according to an exemplary embodiment.

FIG. 4 is a schematic block diagram illustrating a host system and a memory storage apparatus according to an exemplary embodiment.

Referring to FIG. 4, the memory storage apparatus 10 includes a connection interface unit 402, a memory control circuit unit 404 and a rewritable non-volatile memory module 406.

In the present exemplary embodiment, the connection interface unit 402 is compatible with a SATA (Serial Advanced Technology Attachment) standard. Nevertheless, it should be understood that the invention is not limited thereto. The connection interface unit 402 may also be compatible to a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a UHS-I (Ultra High Speed-I) interface standard, a UHS-II (Ultra High Speed-II) interface standard, a SD (Secure Digital) interface standard, a MS (Memory Stick) interface standard, a Multi-Chip Package interface standard, a MMC (Multi Media Card) interface standard, an eMMC (Embedded Multimedia Card) interface standard, a UFS (Universal Flash Storage) interface standard, an eMCP (embedded Multi Chip Package) interface standard, a CF (Compact Flash) interface standard, an IDE (Integrated Device Electronics) interface standard or other suitable standards. In the present exemplary embodiment, the connection interface unit 402 and the memory control circuit unit 404 may be packaged into one chip, or the connection interface unit 402 is distributed outside of a chip containing the memory control circuit unit.

The memory control circuit unit 404 is configured to execute a plurality of logic gates or control instructions which are implemented in a hardware form or in a firmware form and perform operations of writing, reading or erasing data in the rewritable non-volatile memory storage module 406 according to the commands of the host system 11.

The rewritable non-volatile memory module 406 is coupled to the memory control circuit unit 404 and configured to store data written from the host system 11. The rewritable non-volatile memory storage module 406 includes multiple physical erasing units 410(0) to 410(N). For example, the physical erasing units 410(0) to 410(N) may belong to the same memory die or belong to different memory dies. Each physical erasing unit has a plurality of physical programming units, and the physical programming units of the same physical erasing unit may be written separately and erased simultaneously. Nevertheless, it should be understood that the invention is not limited thereto. Each physical erasing unit may be constituted by 64 physical programming units, 256 physical programming units or any amount of the physical programming units.

More specifically, the physical erasing unit is a minimum unit for erasing. Namely, each physical erasing unit contains the least number of memory cells to be erased together. The physical programming unit is the minimum unit for programming. That is, the programming unit is the minimum unit for writing data. Each physical programming unit usually includes a data bit area and a redundancy bit area. The data bit area having multiple physical access addresses is used to store user data, and the redundant bit area is used to store system data (e.g., control information and error checking and correcting code). In the present exemplary embodiment, each data bit area of the physical programming unit contains 8 physical access addresses, and the size of each physical access address is 512 byte. However, in other exemplary embodiments, the data bit area may also contain more or less physical access addresses, and the number and size of the physical access addresses are not limited by the invention. For example, in an exemplary embodiment, the physical erasing unit is a physical block, and the physical programming unit is a physical page or a physical sector. However, the invention is not limited thereto.

In the present exemplary embodiment, the rewritable non-volatile memory module 406 is a TLC (Trinary Level Cell) NAND flash memory module (i.e., a flash memory module capable of storing three data bits in one memory cell). However, the invention is not limited thereto. The rewritable non-volatile memory module 406 may also be a MLC (Multi Level Cell) NAND flash memory module (i.e., a flash memory module capable of storing two data bits in one memory cell) or other memory module having the same features.

Figures 5A, 5B:
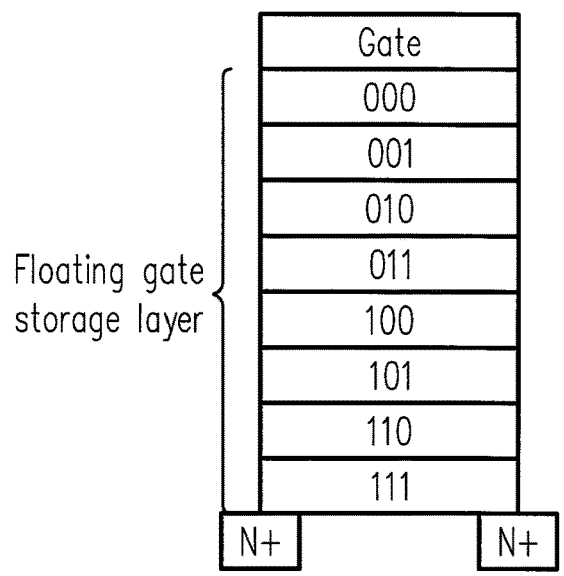
FIG. 5A and FIG. 5B are schematic diagrams illustrating a memory cell storage structure and a physical erasing unit according to an exemplary embodiment.

FIG. 5A and FIG. 5B are schematic diagrams illustrating a memory cell storage structure and a physical erasing unit according to the present exemplary embodiment.

Referring to FIG. 5A, each storage state of each memory cell in the rewritable non-volatile memory module 406 can be identified as "111", "110", "101", "100", "011", "010", "001" or "000" (as shown in FIG. 5A). The first bit counted from the left side of the storage state is the LSB, the second bit counted from the left side of the storage state is the CSB and the third bit counted from the left side of the storage state is the MSB. In addition, the memory cells arranged on the same word line can constitute three physical programming units. Herein, the physical programming units constituted by the LSBs of said memory cells are known as a lower physical programming unit, the physical programming units constituted by the CSBs of said memory cells are known as a center physical programming unit, and the physical programming units constituted by the MSBs of said memory cells are known as an upper physical programming unit.

Referring to FIG. 5B, one physical erasing unit is constituted by a plurality of physical programming unit groups. Each of the physical programming unit groups includes the lower physical programming unit, the center physical programming unit and the upper physical programming unit constituted by multiple memory cells arranged on the same word line. For example, in the physical erasing unit, the 0-th physical programming unit belonging to the lower physical programming unit, the 1-st physical programming unit belonging to the center physical erasing unit and the 2-nd physical programming unit belonging to the upper physical programming unit are regarded as one physical programming unit group. Similarly, the 3-rd, the 4-th, and the 5-th physical programming units are regarded as one physical programming unit group, and by analogy, the other physical programming units are also grouped into multiple physical programming unit groups by the same method. In other words, in the exemplary embodiment of FIG. 5, the physical erasing unit includes 258 physical programming units in total, and the lower physical programming unit, the center physical programming unit and the upper physical programming unit constituted by multiple memory cells arranged on the same word line can constitute one physical programming unit group. Therefore, the physical erasing unit of FIG. 5 may be divided into 86 physical programming unit groups in total. However, it should be noted that, the invention is not intended to limit the numbers of the physical programming unit or the physical programming unit groups in the physical erasing unit.

Figure 6:
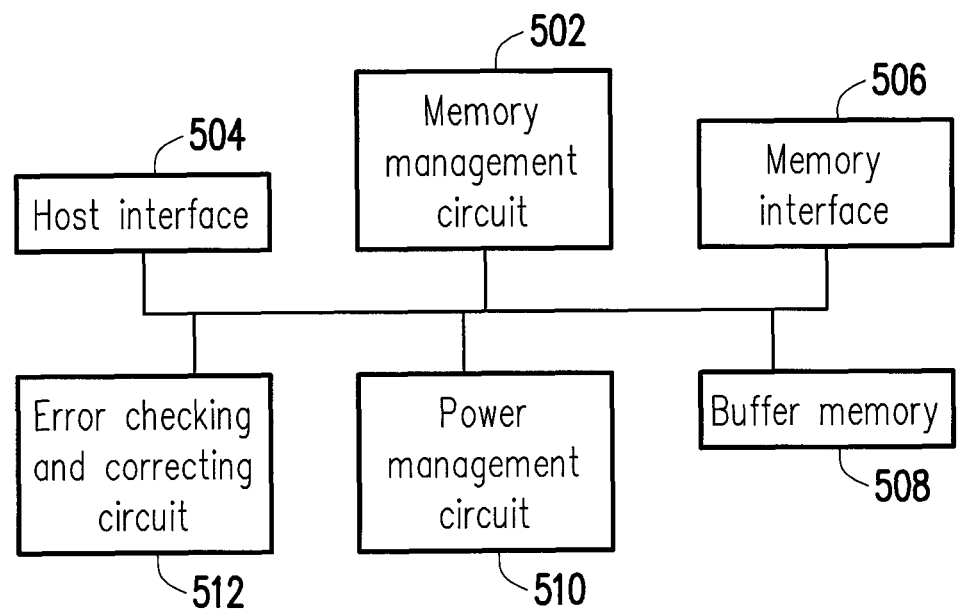
FIG. 6 is a schematic block diagram illustrating a memory control circuit unit according to an exemplary embodiment.

FIG. 6 is a schematic block diagram illustrating a memory control circuit unit according to an exemplary embodiment.

Referring to FIG. 6, the memory control circuit unit 404 includes a memory management circuit 502, a host interface 504, a memory interface 506, a buffer memory 508, a power management circuit 510, and an error checking and correcting circuit 512.

The memory management circuit 502 is configured to control overall operations of the memory control circuit unit 404. Specifically, the memory management circuit 502 has a plurality of control instructions and the control instructions are executed to perform various operations such as writing, reading and erasing data during operation of the memory storage apparatus 10.

In the present exemplary embodiment, the control instructions of the memory management circuit 502 are implemented in form of firmware. For instance, the memory management circuit 502 has a microprocessor unit (not illustrated) and a read-only memory (not illustrated), and the control instructions are burnt into the read-only memory. During operation of the memory storage apparatus 10, the control instructions are executed by the microprocessor to perform operations of writing, reading or erasing data.

Figure 7:
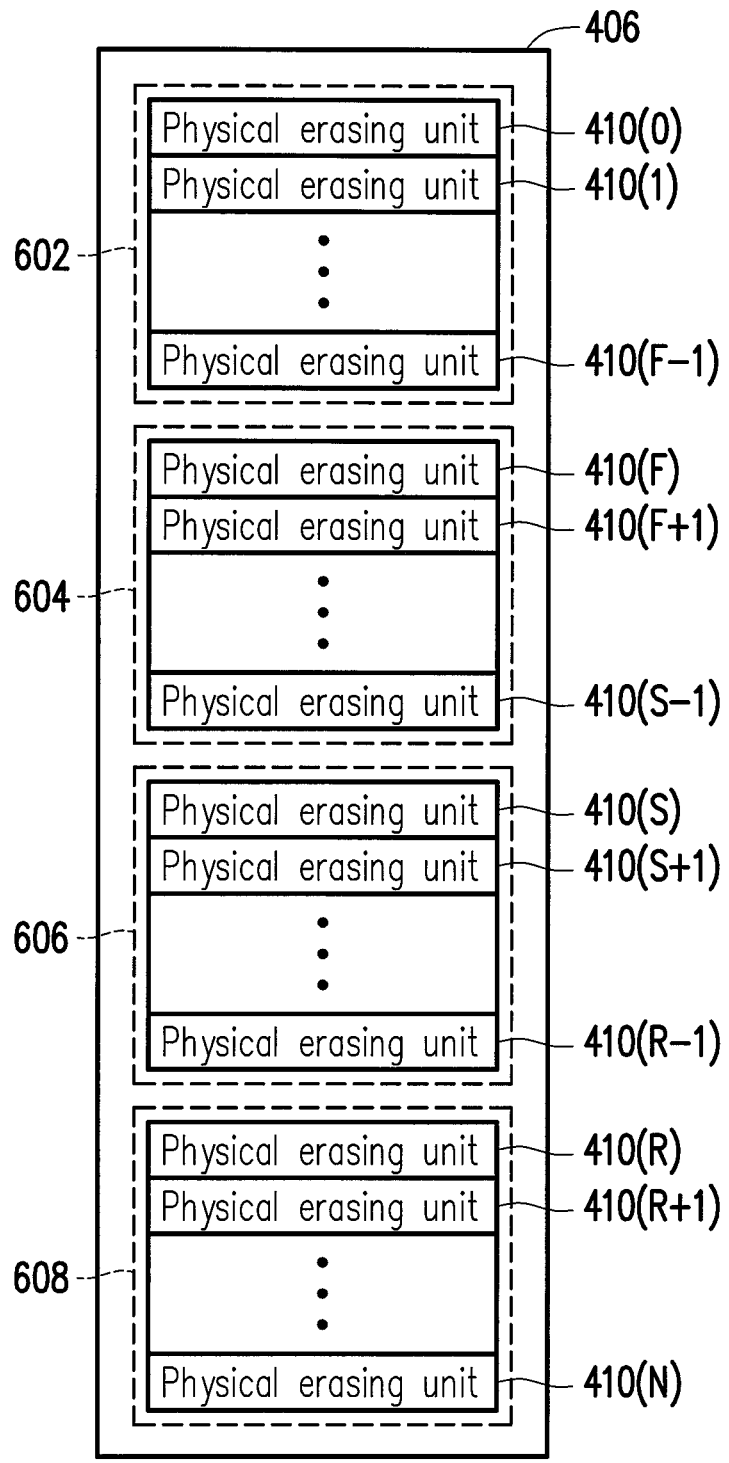
FIG. 7 and FIG. 8 are schematic diagrams illustrating a management of physical blocks according to an exemplary embodiment.
Figure 8:
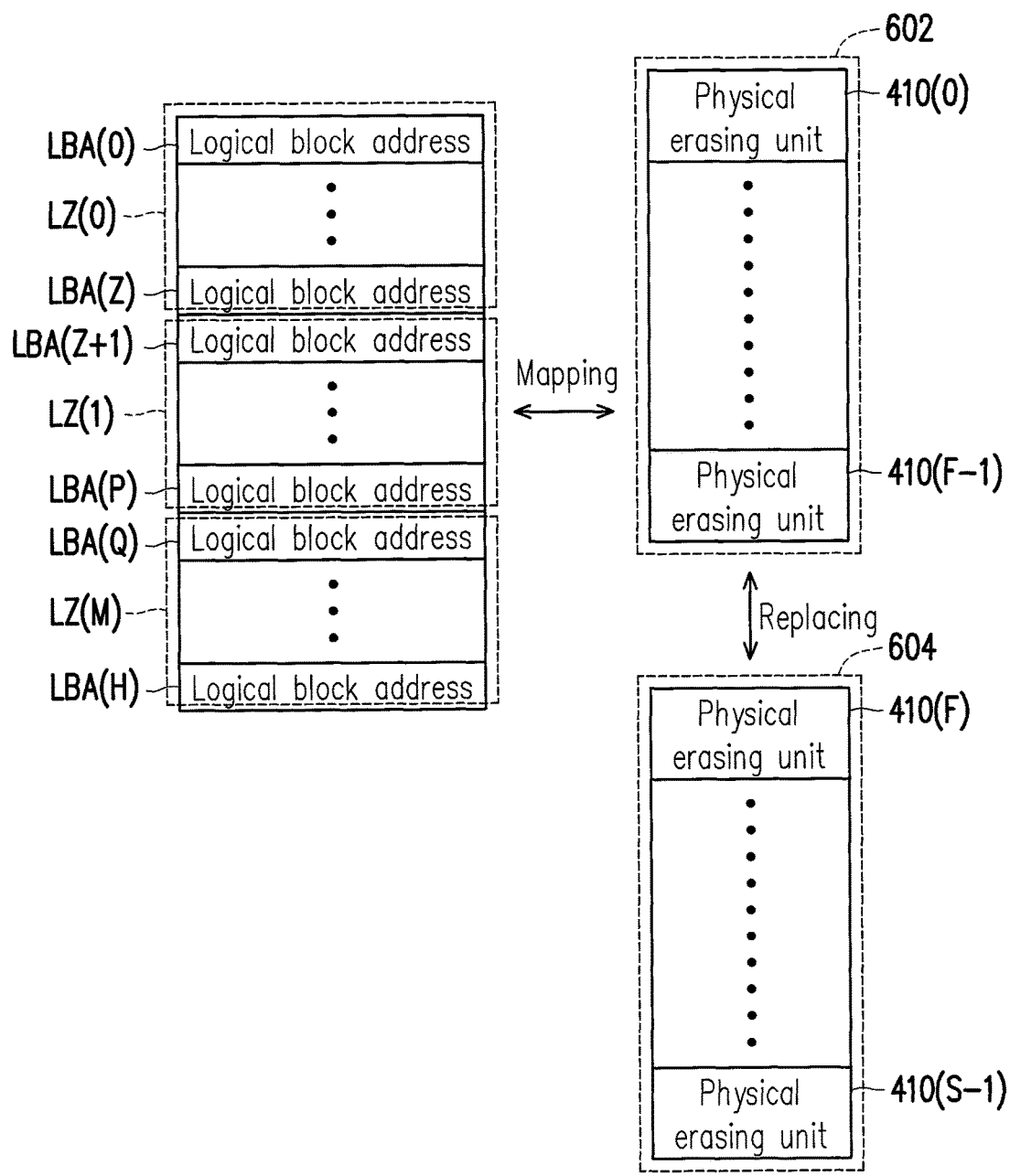

FIG. 7 and FIG. 8 are schematic diagrams illustrating a management of the physical erasing units according to an exemplary embodiment.

It should be understood that terms, such as "retrieve", "group", "divide", "associate" and so forth, are logical concepts which describe operations in the physical erasing units of the rewritable non-volatile memory module 406. In other words, the physical erasing units of the rewritable non-volatile memory module are logically operated so actual positions of the physical units of the rewritable non-volatile memory module are not changed.

Referring to FIG. 7, the memory control circuit unit 404 (or the memory management circuit 502) may logically group the physical erasing units 410(0) to 410(N) into a data area 602, a spare area 604, a system area 606 and a replacement area 608.

The physical erasing units logically belonging to the data area 602 and the spare area 604 are configured to store data from the host system 11. More specifically, the physical erasing units of the data area 602 are regarded as the physical erasing units stored with the data, whereas the physical erasing units of the spare area 604 are configured to replace the physical erasing units of the data area 602. In other words, when the write command and the data to be written are received from the host system 11, the memory control circuit unit 404 (or the memory management unit 502) uses the physical erasing units retrieved from the spare area 604 as replacement to the physical erasing units in the data area 602 for writing data.

The physical erasing units logically belonging to the system area 606 are configured to record system data. For example, the system data includes information related to manufacturer and model of the rewritable non-volatile memory module, a number of physical erasing units in the rewritable non-volatile memory module, a number of the physical programming units in each physical erasing unit, and so forth.

The physical erasing units logically belonging to the replacement area 608 are used in a bad physical erasing unit replacement procedure for replacing damaged physical erasing units. More specifically, if there are still usable physical erasing units available in the replacement area 608 when the physical erasing units of the data area 602 are damaged, the memory control circuit unit 404 (or the memory management unit 502) can retrieve the usable physical erasing units from the replacement area 608 for replacing the damaged physical erasing units.

Particularly, the numbers of the physical erasing units in the data area 602, the spare area 604, the system area 606 and the replacement area 608 may be different from one another according to the different memory specifications. In addition, it should be understood that, during operation of the memory storage apparatus 10, grouping relations of the physical erasing units for associating with the data area 602, the spare area 604, the system area 606, and the replacement area 608 may be dynamically changed. For example, when the damaged physical erasing units in the spare area 604 are replaced by the physical erasing units in the replacement area 608, the physical erasing units originally from the replacement area 608 are then associated with the spare area 604.

Referring to FIG. 8, the memory control circuit unit 404 (or the memory management circuit 502) assigns logical block addresses LBA(0) to LBA(H) for mapping to the physical erasing units of the data area 602. Each of the logical block addresses includes a plurality of logical addresses for mapping to the corresponding physical programming units of the physical erasing units. Further, when the host system 11 intends to write the data into the logical addresses or update the data stored in the logical addresses, the memory control circuit unit 404 (or the memory management unit 502) may retrieve one physical erasing unit from the spare area 604 as an active physical erasing unit to replace the physical erasing units of the data area 602 for writing data. Further, when the active physical erasing unit serving as the active physical erasing unit is fully written, the memory control circuit unit 404 (or the memory management circuit 502) may again retrieve an empty physical erasing unit from the spare area 604 as the active physical erasing unit to continue writing the data corresponding to the write command from the host system 11. Further, when the number of the usable physical erasing units in the spare area 604 is less than a preset value, the memory control circuit unit 404 (or the memory management circuit 502) may perform a garbage collection operation (also known as a valid data merging operation) to arrange the valid data in the data area 602, so as to re-associate the physical erasing units not stored with the valid data in the data area 602 to the spare area 604.

In order to identify which of the physical programming units is data in each of the logical addresses being stored into, the memory control circuit unit 404 (or the memory management circuit 502) may record the mapping relations between the logical addresses and the physical programming units. For example, in the present exemplary embodiment, the memory control circuit unit 404 (or the memory management circuit 502) stores a logical-physical mapping table in the rewritable non-volatile memory module 406 for recording the physical programming unit mapped by each of the logical addresses. When intending to access data, the memory control circuit unit 404 (or the memory management circuit 502) loads the logical-physical mapping table into the buffer memory 508 for maintenance and writes or reads data according to the logical-physical mapping table.

It is worth mentioning that, the buffer memory 508 is unable to store the mapping table recording the mapping relations of all the logical addresses due to limited capacity. Therefore, in the present exemplary embodiment, the memory control circuit unit 404 (or the memory management unit 502) groups the logical block addresses LBA(0) to LBA(H) into a plurality of logical zones LZ(0) to LZ(M), and configures one logical-physical mapping table for each of the logical zones. Particularly, when the memory control circuit unit 404 (or the memory management unit 502) intends to update a mapping of one specific logical block address, the logical-physical table corresponding to the logical zone to which the specific logical block address belongs is loaded into the buffer memory 508 for updating. Specifically, if the logical-physical mapping table corresponding to the logical zone to which the specific logical block address belongs is not temporarily stored in the buffer memory 508 (i.e., the mapping of the logical block address to be updated is not recorded in the logical-physical mapping table temporarily stored in the buffer memory 508), the memory control circuit unit 404 (or the memory management circuit 502) may perform a mapping table swapping operation to restore the current logical-physical mapping table temporarily stored in the buffer memory 508 back to the rewritable non-volatile memory module 406, and loads the logical-physical mapping table recorded with the mapping of the logical block address to be updated into the buffer memory 508.

In another exemplary embodiment, the control instructions of the memory management circuit 502 may also be stored, in form of program codes, into a specific area (e.g., a system area in the memory module exclusively used for storing the system data) of the rewritable non-volatile memory module 406. In addition, the memory management circuit 502 has a microprocessor unit (not illustrated), a ROM (not illustrated) and a RAM (not illustrated). Particularly, the ROM has an activate code, which is executed by the microprocessor unit to load the control instructions stored in the rewritable non-volatile memory module 406 to the RAM of the memory management circuit 502 when the memory control circuit unit 404 is enabled. Later, the control instructions are executed by the microprocessor unit to perform operations of writing, reading or erasing data.

Further, in another exemplary embodiment, the control instructions of the memory management circuit 502 may also be implemented in a form of hardware. For example, the memory management circuit 502 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory management circuit is configured to manage the physical erasing units of the rewritable non-volatile memory module 406; the memory writing circuit is configured to give a write command to the rewritable non-volatile memory module 406 in order to write data into the rewritable non-volatile memory module 406; the memory reading circuit is configured to give a read command to the rewritable non-volatile memory module 406 in order to read data from the rewritable non-volatile memory module 406; the memory erasing circuit is configured to give an erase command to the rewritable non-volatile memory module 406 in order to erase data from the rewritable non-volatile memory module 406; and the data processing circuit is configured to process both data to be written to the rewritable non-volatile memory module 406 and data to be read from the rewritable non-volatile memory module 406.

Referring back to FIG. 6, the host interface 504 is coupled to the memory management circuit 502 and configured to couple to the connection interface unit 402, so as to receive and identify commands and data sent from the host system 11. In other words, the commands and data transmitted by the host system 11 are transmitted to the memory management circuit 502 through the host interface 504. In the present exemplary embodiment, the host interface 504 is compatible with the SATA standard. However, it is to be understood that the invention is not limited thereto. The host interface 504 may also be PATA standard, IEEE 1394 standard, PCI Express standard, USB standard, UHS-I interface standard, UHS-II interface standard, SD standard, MS standard, MMC standard, CF standard, IDE standard, or other suitable standards for data transmission.

The memory interface 506 is coupled to the memory management circuit 502 and configured to access the rewritable non-volatile memory module 406. In other words, data to be written to the rewritable non-volatile memory module 406 is converted into a format acceptable by the rewritable non-volatile memory module 406 through the memory interface 506.

The buffer memory 508 is coupled to the memory management circuit 502 and configured to temporarily store data and commands from the host system 11 or data from the rewritable non-volatile memory module 406.

The power management unit 510 is coupled to the memory management circuit 502 and configured to control power of the memory storage apparatus 10.

The error checking and correcting circuit 512 is coupled to the memory management circuit 502 and configured to perform an error checking and correcting procedure to ensure the correctness of data. For example, when a write command is received by the memory management circuit 502 from the host system 11, the error checking and correcting circuit 512 generates an ECC code (error checking and correcting code) for data corresponding to the write command, and the memory management circuit 502 writes data and the ECC code corresponding to the write command to the rewritable non-volatile memory module 406. Subsequently, the memory management circuit 502 can read the error checking and correcting code corresponding to the data while reading the data from the rewritable non-volatile memory module 406, and the error checking and correcting circuit 512 can then perform the error checking and correcting procedure for the read data according to the error checking and correcting code.

It is worth mentioning that, in the present exemplary embodiment, the memory control circuit unit 404 (or the memory management circuit 502) programs the data into the rewritable non-volatile memory module 406 by using different programming modes in different states. For example, the memory control circuit unit 404 (or the memory management circuit 502) may program the data into the physical erasing unit by using a single page programming mode or a multiple page programming mode. Herein, a programming speed of programming the memory cells based on the single page programming mode is higher than a programming speed of programming the memory cells based on the multiple page programming mode (i.e., an operating time required when programming data by using the multiple page programming mode is greater than an operating time required when programming data by using the single page programming mode). Moreover, a reliability of the data stored based on the single page programming mode is often higher than a reliability of the data stored based on the multiple page programming mode. The single page programming mode is, for example, one of a SLC (Single Level Cell) programming mode, a lower physical programming mode, a mixture programming mode and a less level cell programming mode. More specifically, in the single level cell programming mode, one memory cell is only stored with data of one bit. In the lower physical programming mode, only the lower physical programming units are programmed, and the upper physical programming units corresponding to the lower physical programming units may not be programmed. In the mixture programming mode, valid data (or real data) are programmed into the lower physical programming units, and dummy data is programmed into the upper physical programming units corresponding to the lower physical programming units sorted with the valid data. In the less level cell programming mode, one memory cell is stored with data of a first number of bits. For example, the first number may be set as "1". The multiple page programming mode is, for example, a MLC (Multiple Level cell) programming mode, a TLC (Trinary Level Cell) programming mode or other similar modes. In the multiple page programming mode, one memory cell is stored with data of a second number of bits, and the second number is equal to or greater than "2". For example, the second number may be set as 2 or 3. In another exemplary embodiment, both the first number in the single page programming mode and the second number in the multiple page programming mode may be other numbers as long as the second number is greater than the first number. In other words, the number (i.e., the first number) of data bits stored in each of the memory cells constituting a first-type physical erasing unit programmed by using the single page programming mode is less than the number (i.e., the second number) of data bits stored in each of the memory cells constituting a second-type physical erasing unit programmed by using the multiple page programming mode.

Based on the above, the number of data bits stored by the memory cells programmed by using the multiple page programming mode is greater than the number of data bits stored in the memory cells programmed by using the single page programming mode. Therefore, a data capacity of the physical erasing unit programmed by using the multiple page programming mode is greater than a data capacity of the physical erasing unit programmed by using the single page programming mode. For example, in the present exemplary embodiment, when an amount of data stored by the rewritable non-volatile memory module 406 is smaller, the memory control circuit unit 404 (or the memory management circuit 502) may use the single page programming mode to reduce the time required for programming (i.e., improve the programming speed). Conversely, when the amount of data stored by the rewritable non-volatile memory module 406 exceeds a predefined value, the memory control circuit unit 404 (or the memory management circuit 502) may use the multiple page programming mode for writing data instead.

FIGS. 9 to 21 illustrate an example of writing data according to an exemplary embodiment of the invention. In this example, data is programmed into the physical erasing unit by using the multiple page programming mode (i.e., each of the physical programming units will be used for storing data).

Figure 9:
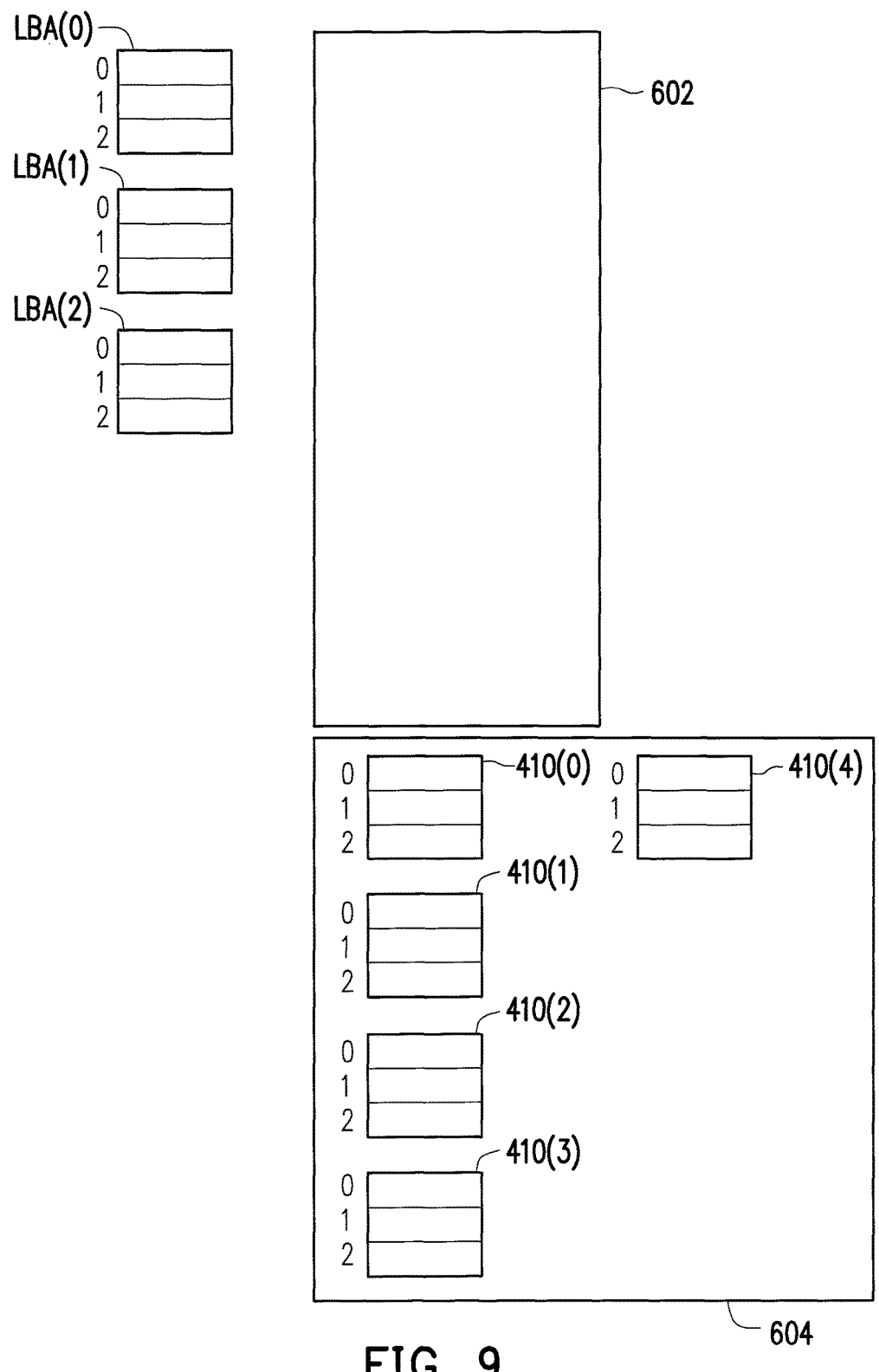
FIGS. 9 to 21 illustrate an example of writing data according to an exemplary embodiment.

Referring to FIG. 9, for convenience of illustration, it is assumed that, initially, the data area 602 does not include any physical erasing unit mapped to the logical block address (i.e., the memory storage apparatus 10 is not yet written with the user data after the formatting process) and the spare area 604 includes five physical erasing units. Also, each of the physical erasing units includes three physical programming units, and the data to be written into each of the physical erasing units must be written according to a sequence of the physical programming units. It is further assumed that the memory control circuit unit 404 (or the memory management circuit 502) assigns 3 logical block addresses for the host system 11 to access and sets a garbage collection threshold as 1. Moreover, each of logical block addresses has three logical addresses and a capacity of each of the logical addresses is equal to a capacity of one physical programming unit.

Figure 10:
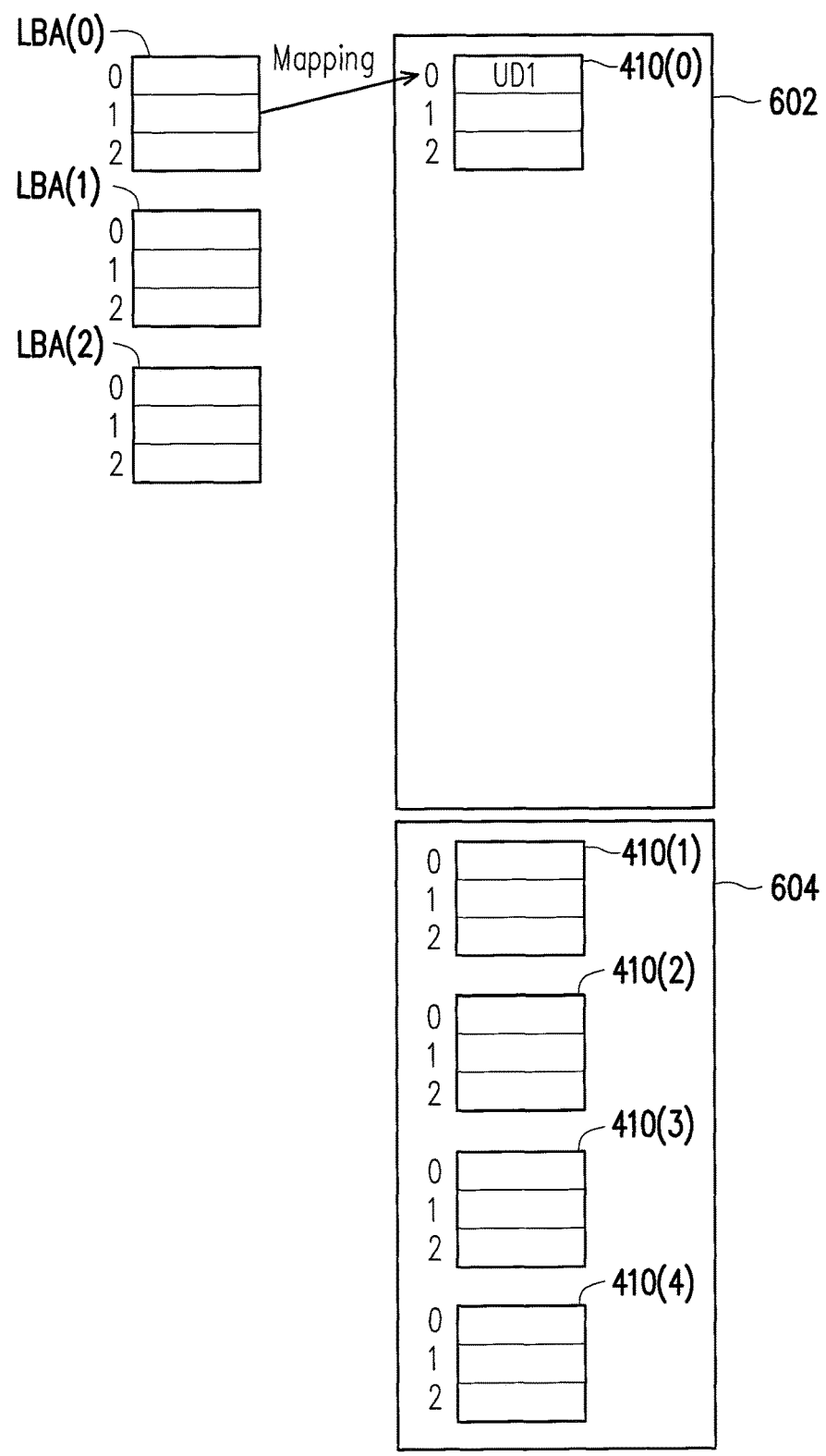

Referring to FIG. 10, it is assumed that data UD1 is to be programmed and the data UD1 belongs to the 1-st logical address of the logical block address LBA(0). Accordingly, the memory control circuit unit 404 (or the memory management circuit 502) retrieves the physical erasing unit 410(0) from the spare area 604, and gives a program command to write the data UD1 into the 0-th physical programming unit of the physical erasing unit 410(0). Further, the memory control circuit unit 404 (or the memory management circuit 502) maps the 1-st logical address of the logical block address LBA(0) to the 0-th physical programming unit of the physical erasing unit 410(0) in the logical-physical mapping table (i.e., the physical erasing unit 410(0) is associated with the data area 602), and updates a valid data count corresponding to the physical erasing unit 410(0) as 1 in a valid data count table.

Figure 11:
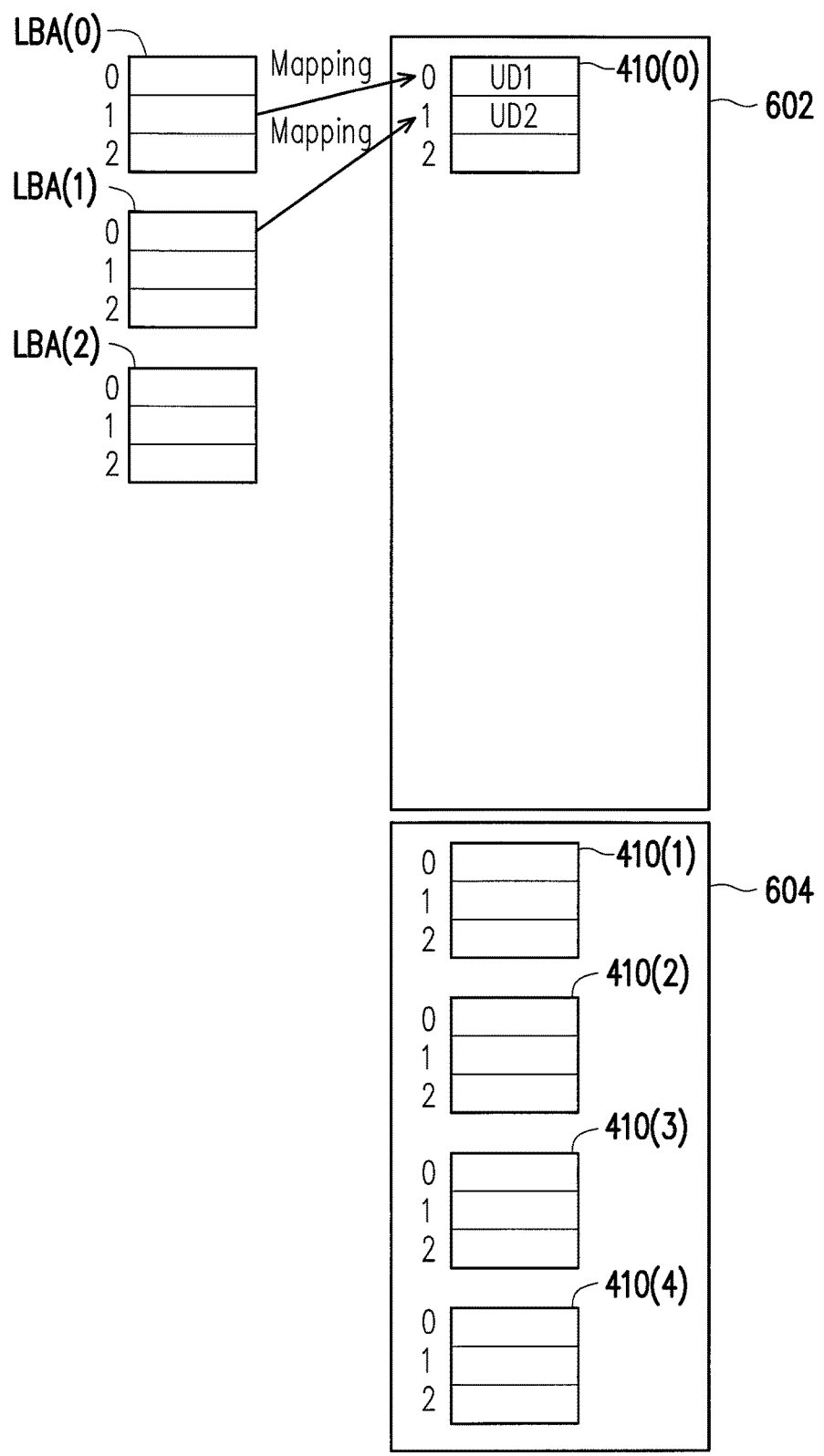

Referring to FIG. 11 as a continuation of FIG. 10, it is assumed that data UD2 is to be further programmed and the data UD2 belongs to the 0-th logical address of the logical block address LBA(1). Accordingly, the memory control circuit unit 404 (or the memory management circuit 502) gives a program command to write the data UD2 into the 1-st physical programming unit of the physical erasing unit 410(0). Further, the memory control circuit unit 404 (or the memory management circuit 502) maps the 0-th logical address of the logical block address LBA(1) to the 1-st physical programming unit of the physical erasing unit 410(0) in the logical-physical mapping table, and updates the valid data count corresponding to the physical erasing unit 410(0) as 2 in the valid data count table.

Figure 12:
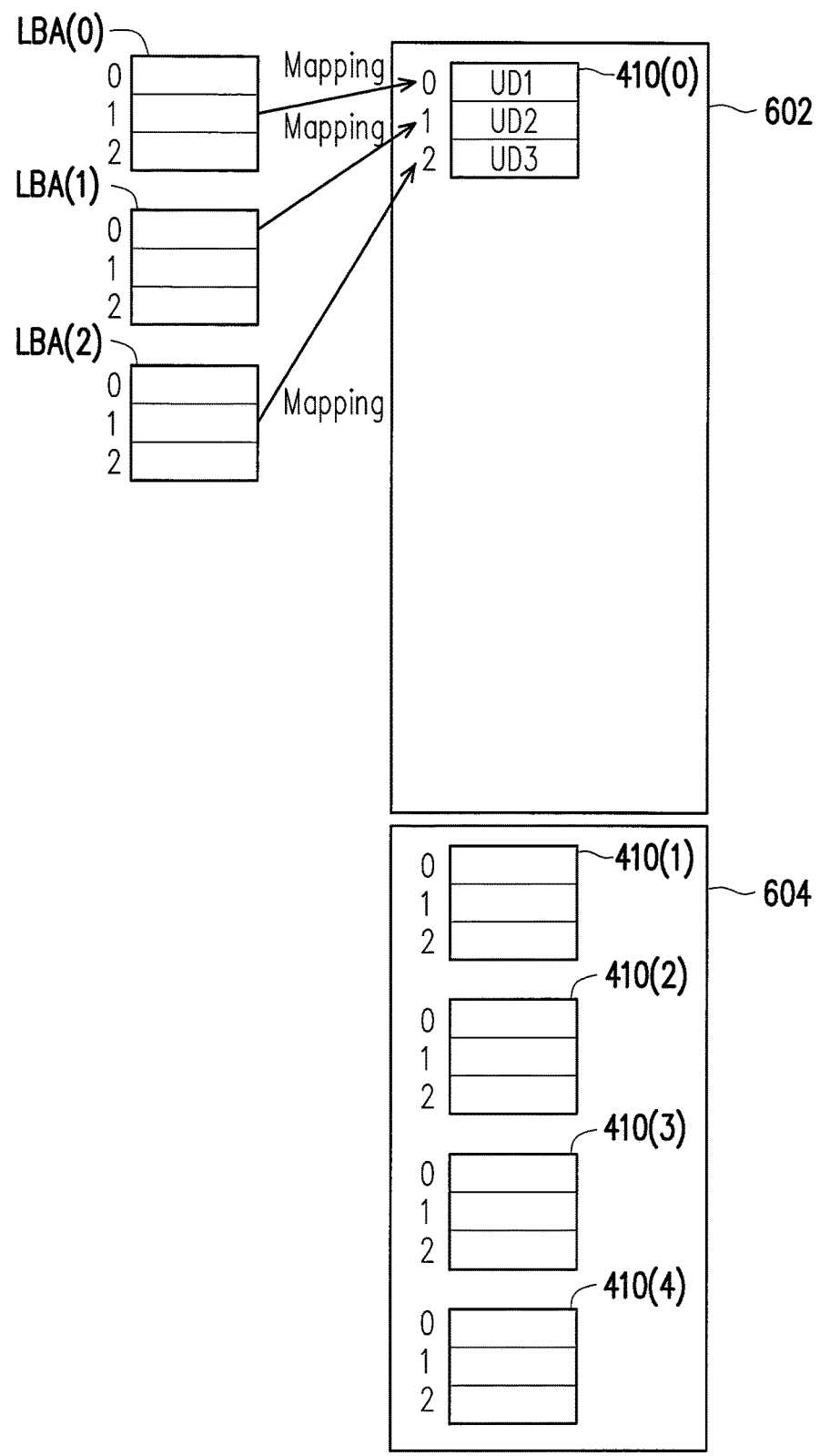

Referring to FIG. 12 as a continuation of FIG. 11, it is assumed that data UD3 is to be further programmed and the data UD3 belongs to the 1-st logical address of the logical block address LBA(2). Accordingly, the memory control circuit unit 404 (or the memory management circuit 502) gives a program command to write the data UD3 into the 2-nd physical programming unit of the physical erasing unit 410(0). Further, the memory control circuit unit 404 (or the memory management circuit 502) maps the 1-st logical address of the logical block address LBA(2) to the 2-nd physical programming unit of the physical erasing unit 410(0) in the logical-physical mapping table, and updates the valid data count corresponding to the physical erasing unit 410(0) as 3 in the valid data count table.

Figure 13:
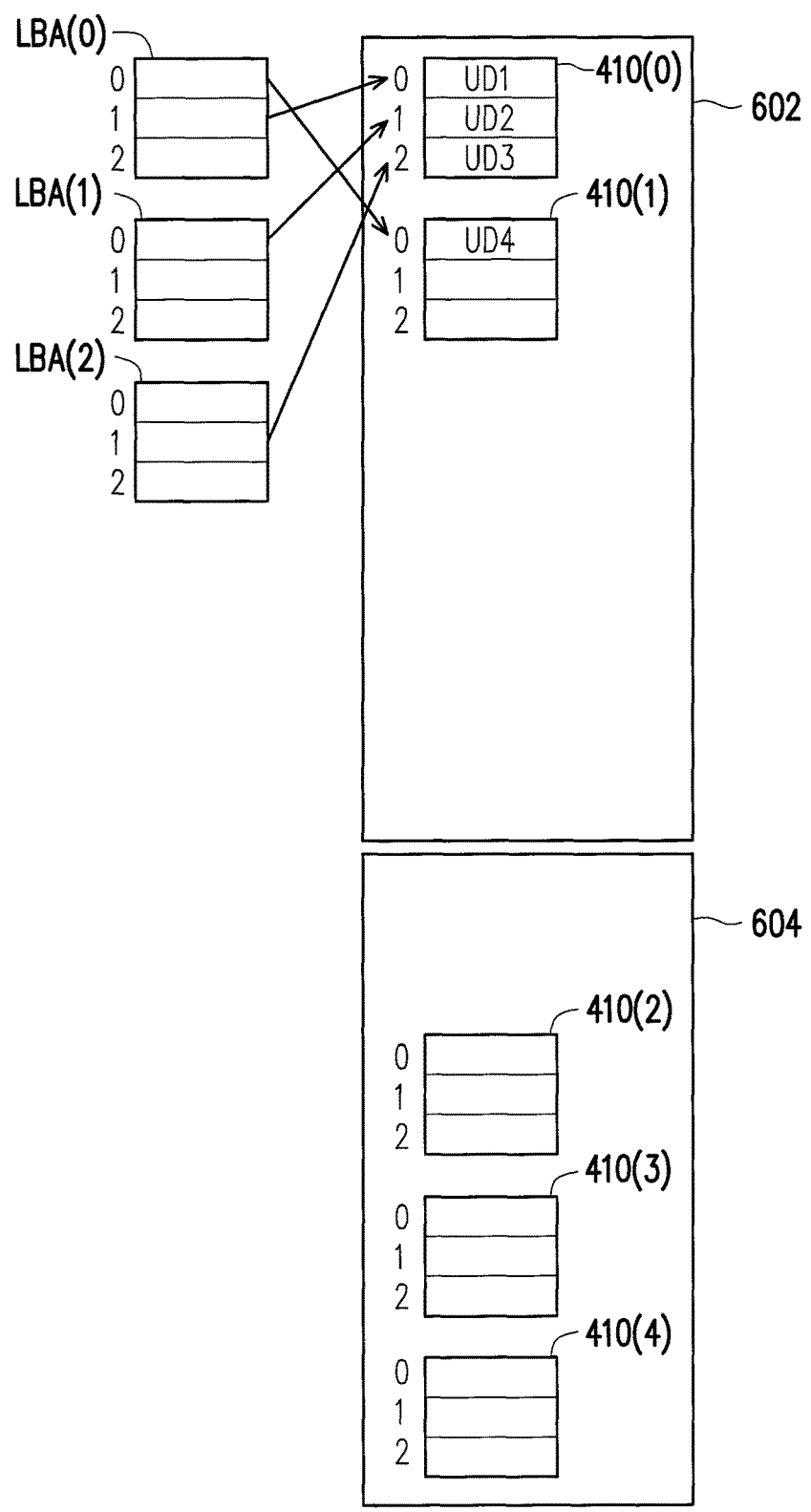

Referring to FIG. 13 as a continuation of FIG. 12, it is assumed that data UD4 is to be further programmed and the data UD4 belongs to the 0-th logical address of the logical block address LBA(0), but the physical erasing unit 410(0) is out of storage spaces. In this case, the memory control circuit unit 404 (or the memory management circuit 502) retrieves the physical erasing unit 410(1) from the spare area 604, gives a program command to write the data UD4 into the 0-th physical programming unit of the physical erasing unit 410(1), and associates the physical erasing unit 410(1) with the data area 602. Further, the memory control circuit unit 404 (or the memory management circuit 502) maps the 0-th logical address of the logical block address LBA(0) to the 0-th physical programming unit of the physical erasing unit 410(1) in the logical-physical mapping table (i.e., the physical erasing unit 410(1) is associated with the data area 602), and updates a valid data count corresponding to the physical erasing unit 410(1) as 1 in the valid data count table.

Figure 14:
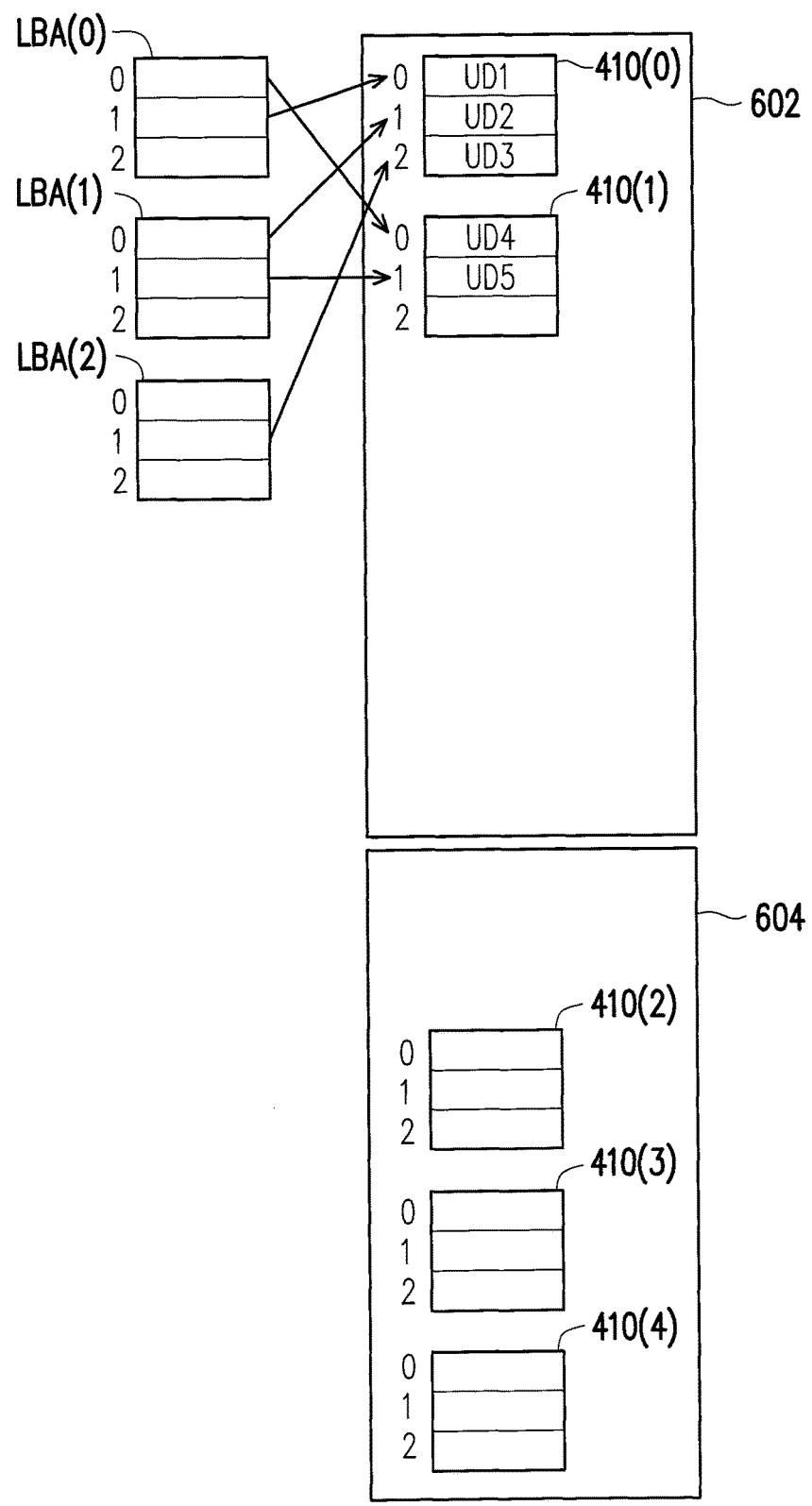

Referring to FIG. 14 as a continuation of FIG. 13, it is assumed that data UD5 is to be further programmed and the data UD5 belongs to the 1-st logical address of the logical block address LBA(1). Accordingly, the memory control circuit unit 404 (or the memory management circuit 502) gives a program command to write the data UD5 into the 1-st physical programming unit of the physical erasing unit 410(1). Further, the memory control circuit unit 404 (or the memory management circuit 502) maps the 1-st logical address of the logical block address LBA(1) to the 1-st physical programming unit of the physical erasing unit 410(1) in the logical-physical mapping table, and updates the valid data count corresponding to the physical erasing unit 410(1) as 2 in the valid data count table.

Figure 15:
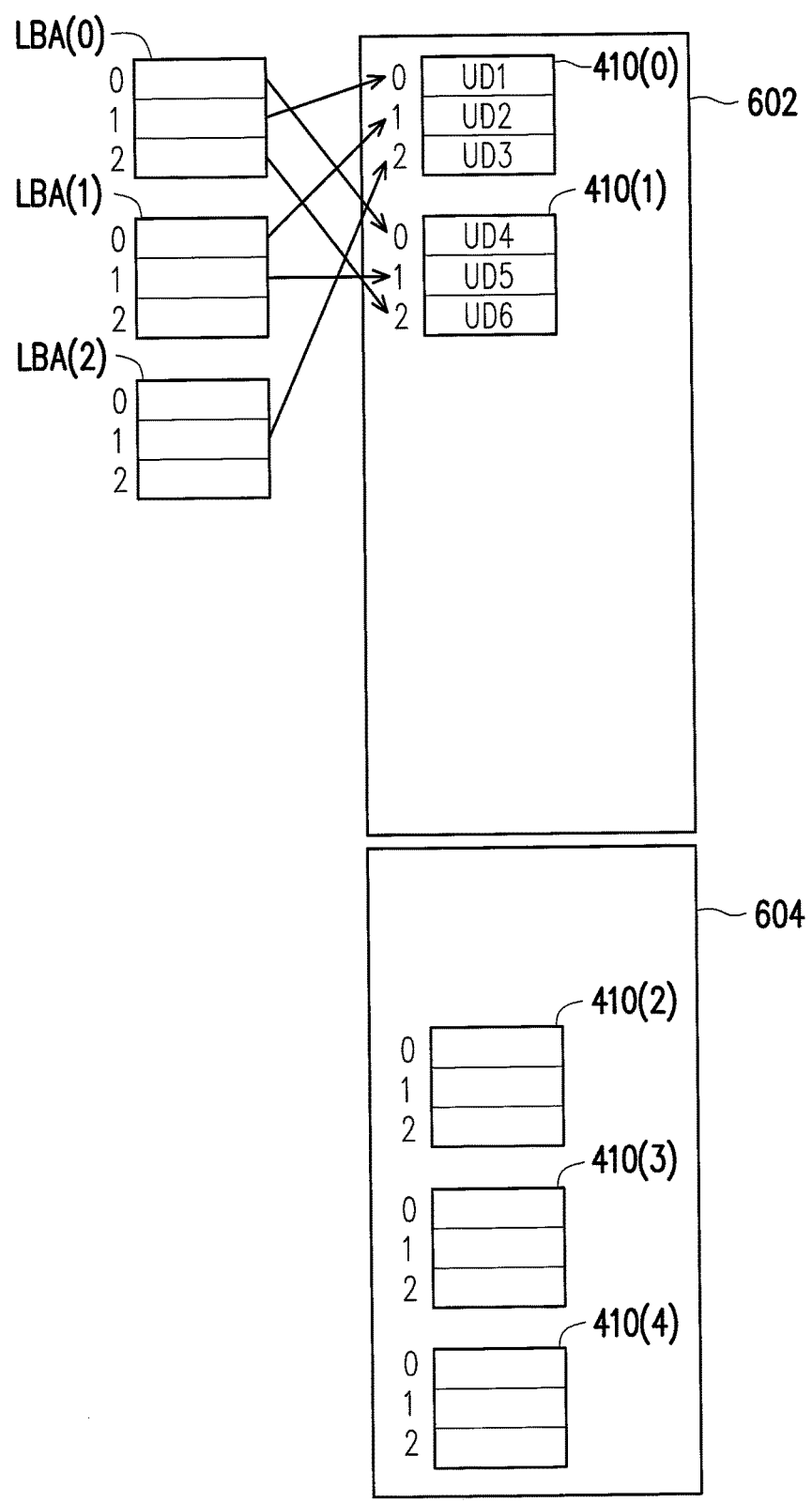

Referring to FIG. 15 as a continuation of FIG. 14, it is assumed that data UD6 is to be further programmed and the data UD5 belongs to the 2-nd logical address of the logical block address LBA(0). Accordingly, the memory control circuit unit 404 (or the memory management circuit 502) gives a program command to write the data UD6 into the 2-nd physical programming unit of the physical erasing unit 410(1). Further, the memory control circuit unit 404 (or the memory management circuit 502) maps the 2-nd logical address of the logical block address LBA(0) to the 2-nd physical programming unit of the physical erasing unit 410(1) in the logical-physical mapping table, and updates the valid data count corresponding to the physical erasing unit 410(1) as 3 in the valid data count table.

Figure 16:
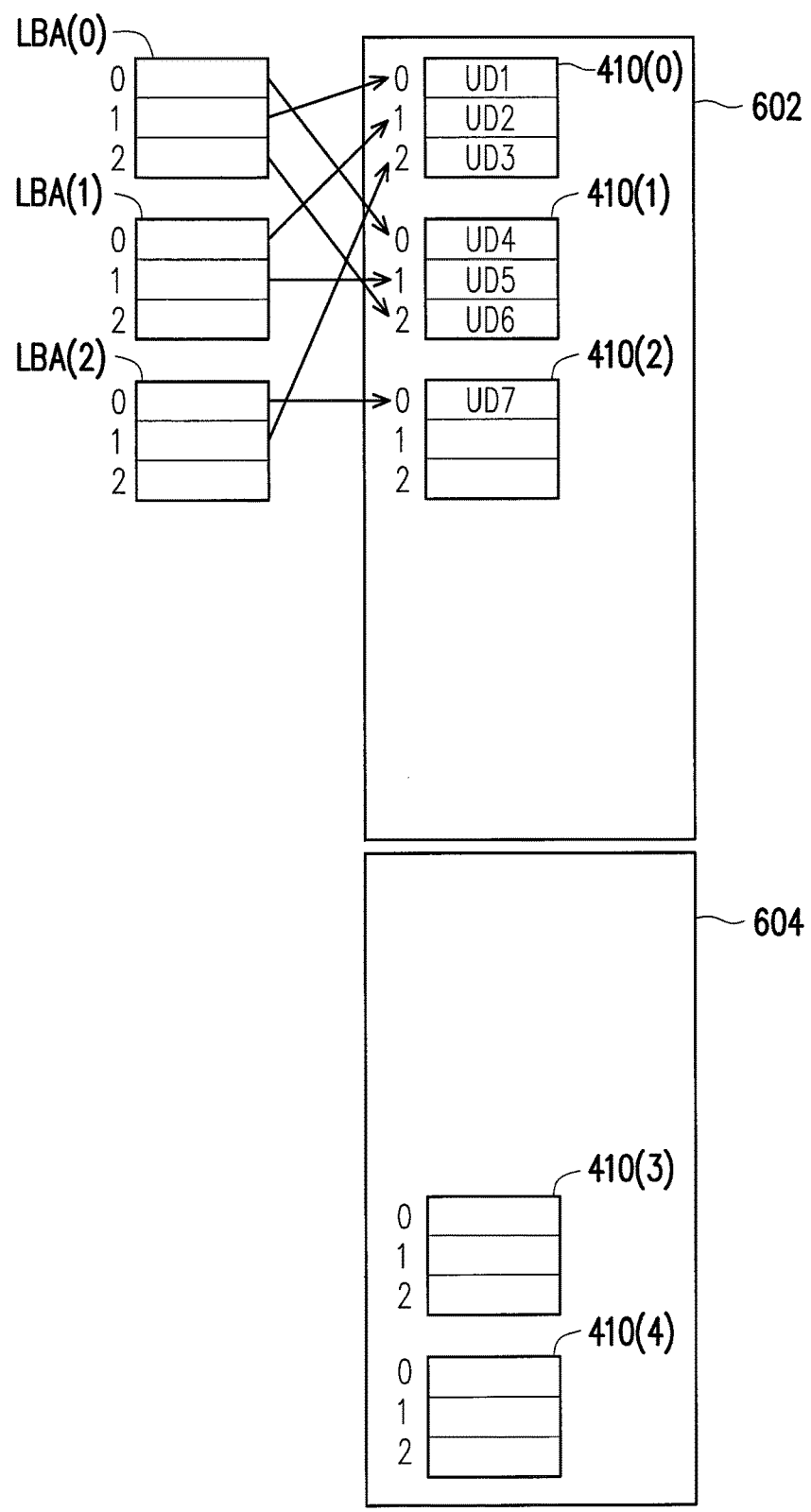

Referring to FIG. 16 as a continuation of FIG. 15, it is assumed that data UD7 is to be further programmed and the data UD7 belongs to the 0-th logical address of the logical block address LBA(2), but the physical erasing unit 410(1) is out of storage spaces. In this case, the memory control circuit unit 404 (or the memory management circuit 502) retrieves the physical erasing unit 410(2) from the spare area 604, gives a program command to write the data UD7 into the 0-th physical programming unit of the physical erasing unit 410(2), and associates the physical erasing unit 410(2) with the data area 602. Further, the memory control circuit unit 404 (or the memory management circuit 502) maps the 0-th logical address of the logical block address LBA(2) to the 0-th physical programming unit of the physical erasing unit 410(2) in the logical-physical mapping table (i.e., the physical erasing unit 410(2) is associated with the data area 602), and updates a valid data count corresponding to the physical erasing unit 410(2) as 1 in the valid data count table.

Figure 17:
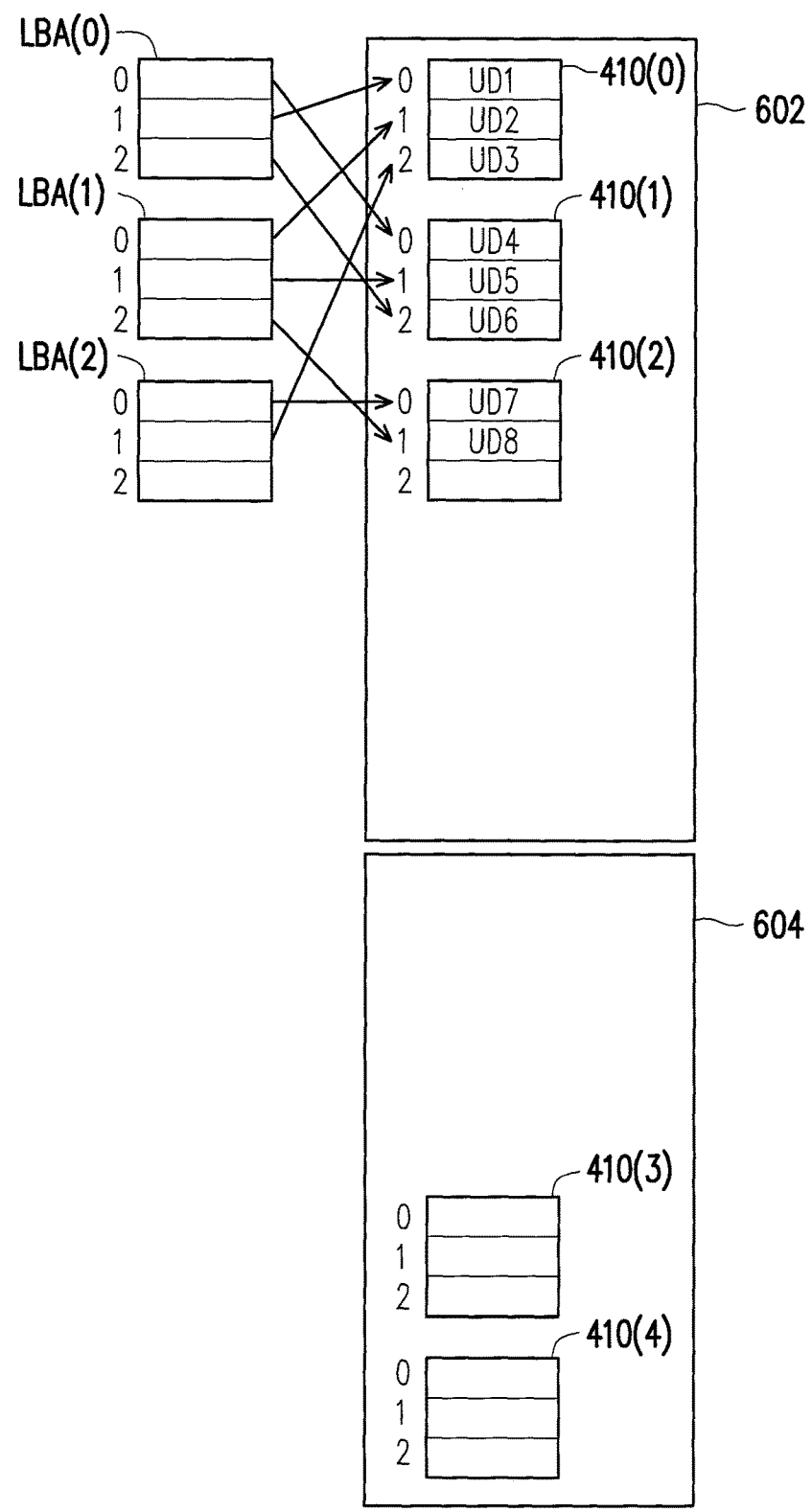

Referring to FIG. 17 as a continuation of FIG. 16, it is assumed that data UD8 is to be further programmed and the data UD8 belongs to the 2-nd logical address of the logical block address LBA(1). Accordingly, the memory control circuit unit 404 (or the memory management circuit 502) gives a program command to write the data UD8 into the 1-st physical programming unit of the physical erasing unit 410(2). Further, the memory control circuit unit 404 (or the memory management circuit 502) maps the 2-nd logical address of the logical block address LBA(1) to the 1-st physical programming unit of the physical erasing unit 410(2) in the logical-physical mapping table, and updates the valid data count corresponding to the physical erasing unit 410(2) as 2 in the valid data count table.

Figure 18:
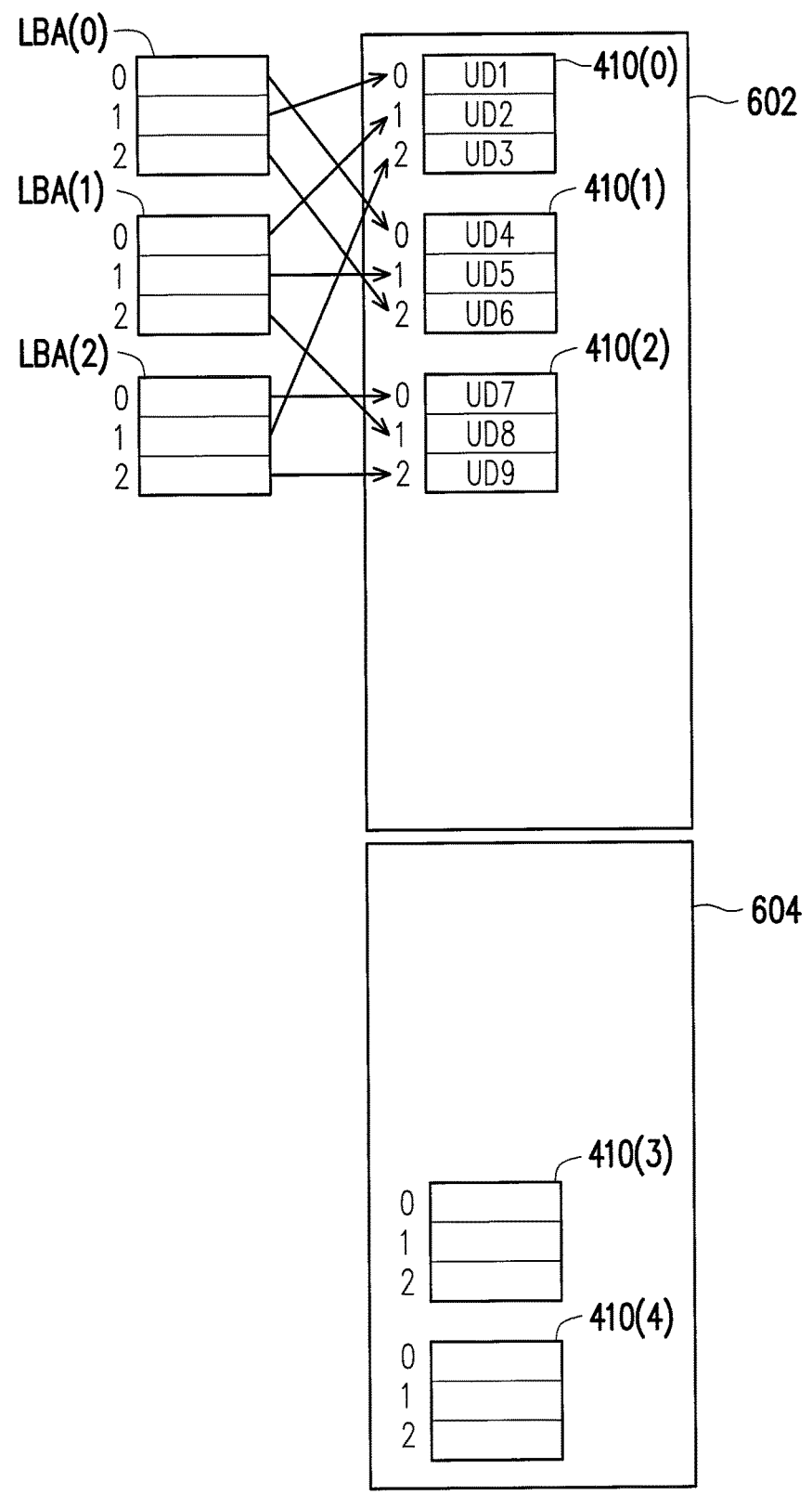

Referring to FIG. 18 as a continuation of FIG. 17, it is assumed that data UD9 is to be further programmed and the data UD9 belongs to the 2-nd logical address of the logical block address LBA(2). Accordingly, the memory control circuit unit 404 (or the memory management circuit 502) gives a program command to write the data UD9 into the 2-nd physical programming unit of the physical erasing unit 410(2). Further, the memory control circuit unit 404 (or the memory management circuit 502) maps the 2-nd logical address of the logical block address LBA(2) to the 2-nd physical programming unit of the physical erasing unit 410(2) in the logical-physical mapping table, and updates the valid data count corresponding to the physical erasing unit 410(2) as 3 in the valid data count table.

Figure 19:
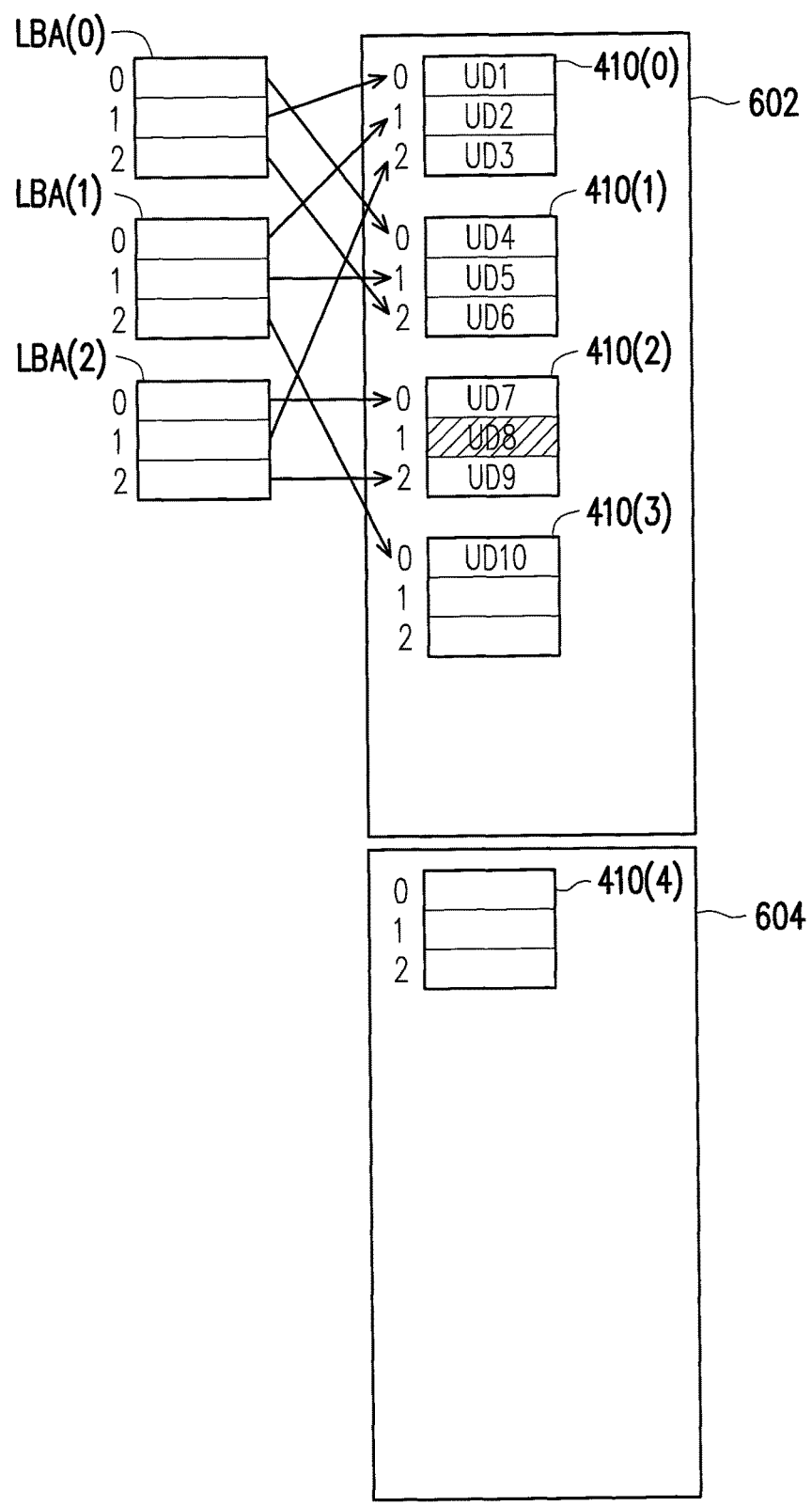

Referring to FIG. 19 as a continuation of FIG. 18, it is assumed that data UD10 is to be further programmed and the data UD10 belongs to the 2-nd logical address of the logical block address LBA(1), but the physical erasing unit 410(2) is out of storage spaces. In this case, the memory control circuit unit 404 (or the memory management circuit 502) retrieves the physical erasing unit 410(3) from the spare area 604, and gives a program command to write the data UD10 into the 0-th physical programming unit of the physical erasing unit 410(3). Further, the memory control circuit unit 404 (or the memory management circuit 502) maps the 2-nd logical address of the logical block address LBA(1) to the 0-th physical programming unit of the physical erasing unit 410(3) in the logical-physical mapping table (i.e., the physical erasing unit 410(3) is associated with the data area 602), and updates a valid data count corresponding to the physical erasing unit 410(3) as 1 in the valid data count table. Specifically, the data of the 1-st physical programming unit of the physical erasing unit 410(2) originally mapped to the 2-nd logical address of the logical block address LBA(1) has now become the invalid data (as marked by slash lines). Therefore, the memory control circuit unit 404 (or the memory management circuit 502) updates the valid data count corresponding to the physical erasing unit 410(2) as 2 in the valid data count table.

Figure 20:
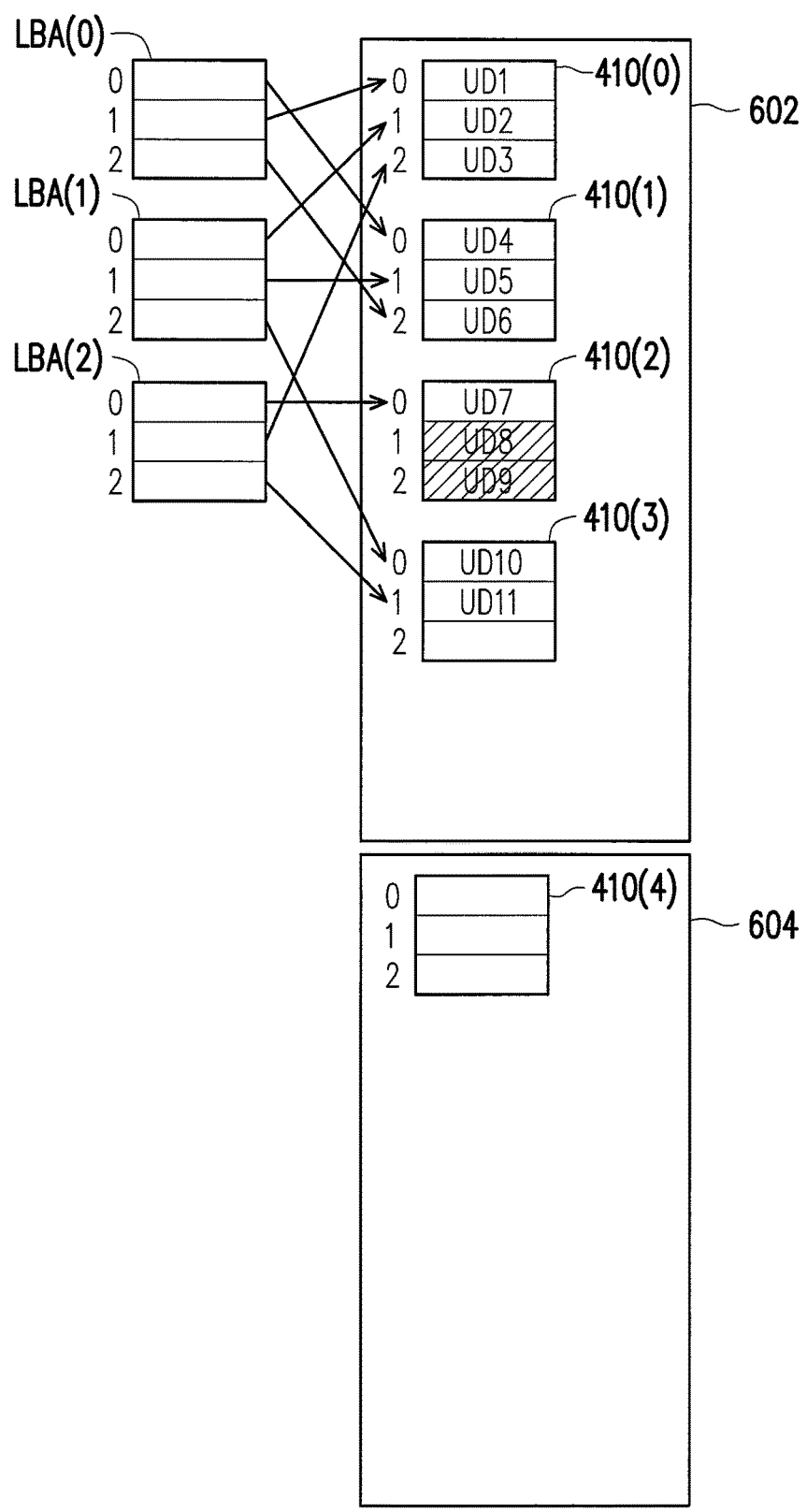

Referring to FIG. 20 as a continuation of FIG. 19, it is assumed that data UD11 is to be further programmed and the data UD11 belongs to the 2-nd logical address of the logical block address LBA(2). Accordingly, the memory control circuit unit 404 (or the memory management circuit 502) gives a program command to write the data UD11 into the 1-st physical programming unit of the physical erasing unit 410(3). Further, the memory control circuit unit 404 (or the memory management circuit 502) maps the 2-nd logical address of the logical block address LBA(2) to the 1-st physical programming unit of the physical erasing unit 410(3) in the logical-physical mapping table, and updates the valid data count corresponding to the physical erasing unit 410(3) as 2 in the valid data count table. Specifically, the data of the 2-nd physical programming unit of the physical erasing unit 410(2) originally mapped to the 2-nd logical address of the logical block address LBA(2) has now become the invalid data (as marked by slash lines). Therefore, the memory control circuit unit 404 (or the memory management circuit 502) updates the valid data count corresponding to the physical erasing unit 410(2) as 1 in the valid data count table.

Figure 21:
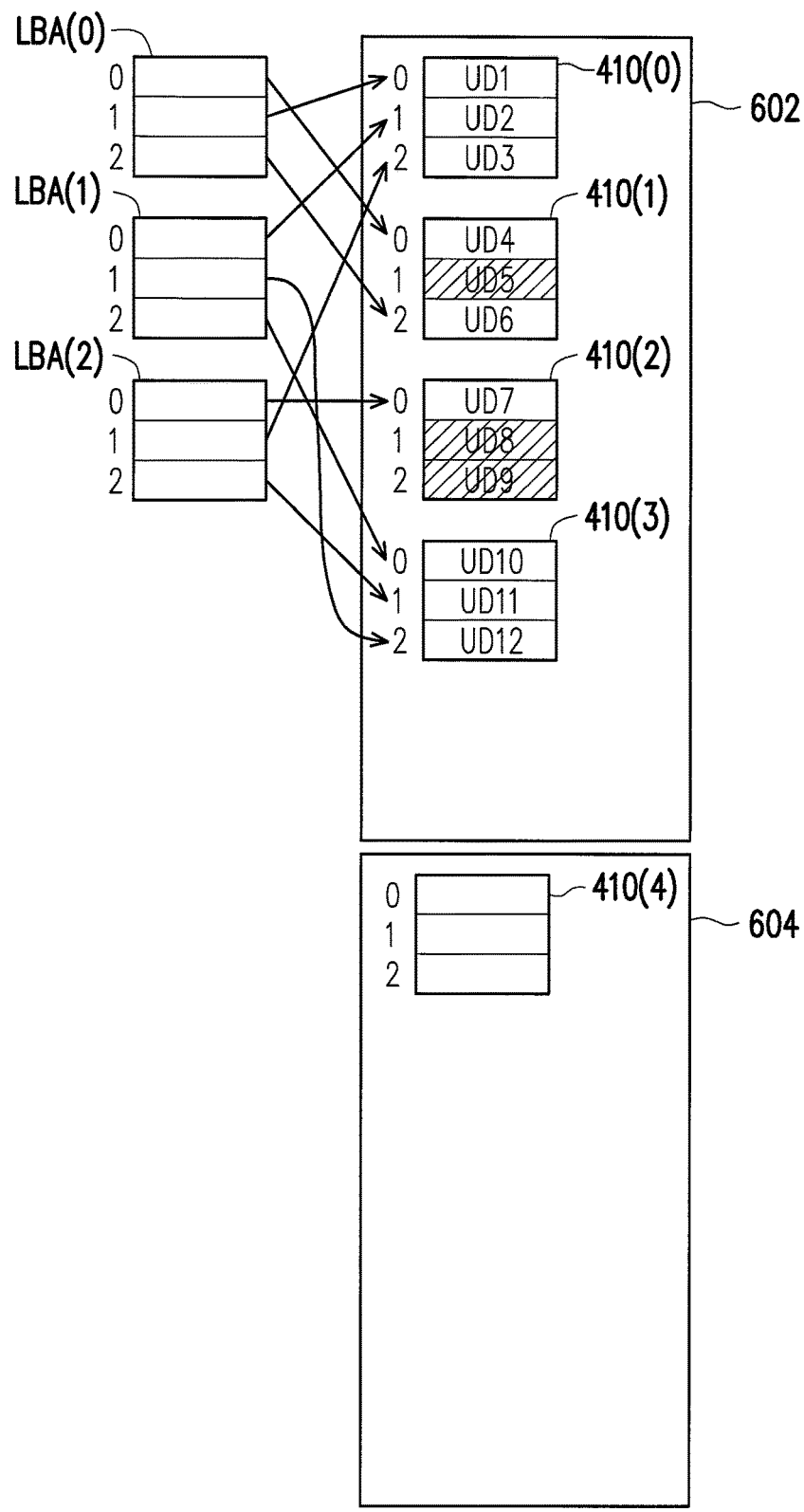

Referring to FIG. 21 as a continuation of FIG. 20, it is assumed that data UD12 is to be further programmed and the data UD12 belongs to the 1-st logical address of the logical block address LBA(1). Accordingly, the memory control circuit unit 404 (or the memory management circuit 502) gives a program command to write the data UD12 into the 2-nd physical programming unit of the physical erasing unit 410(3). Further, the memory control circuit unit 404 (or the memory management circuit 502) maps the 1-st logical address of the logical block address LBA(1) to the 2-nd physical programming unit of the physical erasing unit 410(3) in the logical-physical mapping table, and updates the valid data count corresponding to the physical erasing unit 410(3) as 3 in the valid data count table. Specifically, the data of the 1-st physical programming unit of the physical erasing unit 410(1) originally mapped to the 1-st logical address of the logical block address LBA(1) has now become the invalid data (as marked by slash lines). Therefore, the memory control circuit unit 404 (or the memory management circuit 502) updates the valid data count corresponding to the physical erasing unit 410(1) as 2 in the valid data count table.

In this way, regardless of whichever logical addresses of the logical block address the host system 11 intends to store the data into, the memory control circuit unit 404 (or the memory management circuit 502) can sequentially write the data to be stored by the host system 11 into the physical erasing unit currently being used. Particularly, when the number of the physical erasing units of the spare area 604 is not greater than the garbage collection threshold, the memory control circuit unit 404 (or the memory management circuit 502) also performs a garbage collection operation while executing the write command, so as to prevent the physical erasing units of the spare area from being used up.

Figure 22:
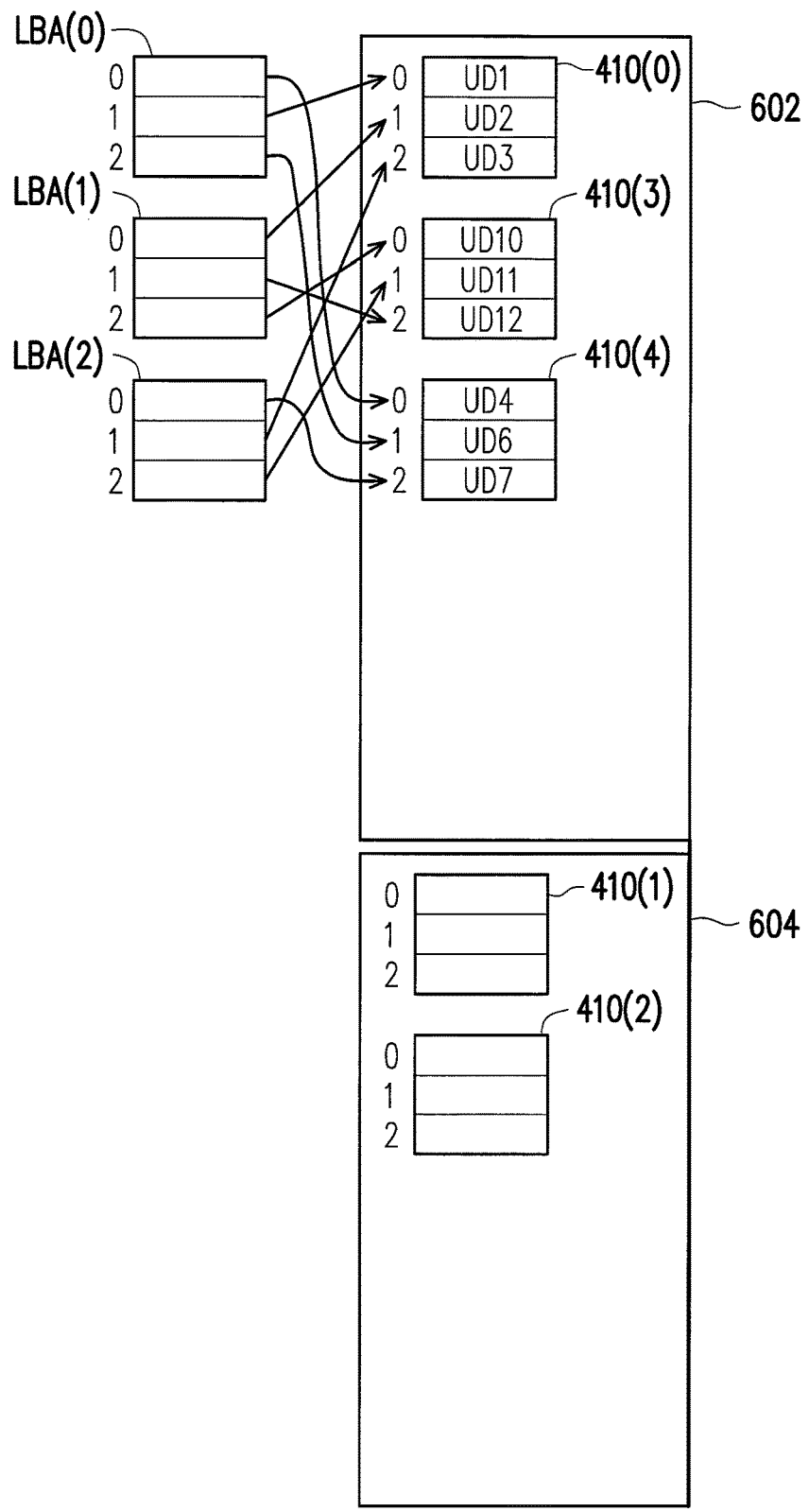
FIGS. 22 and 23 illustrate a simplified example of performing a garbage collection operation in order to complete subsequent write commands.
Figure 23:
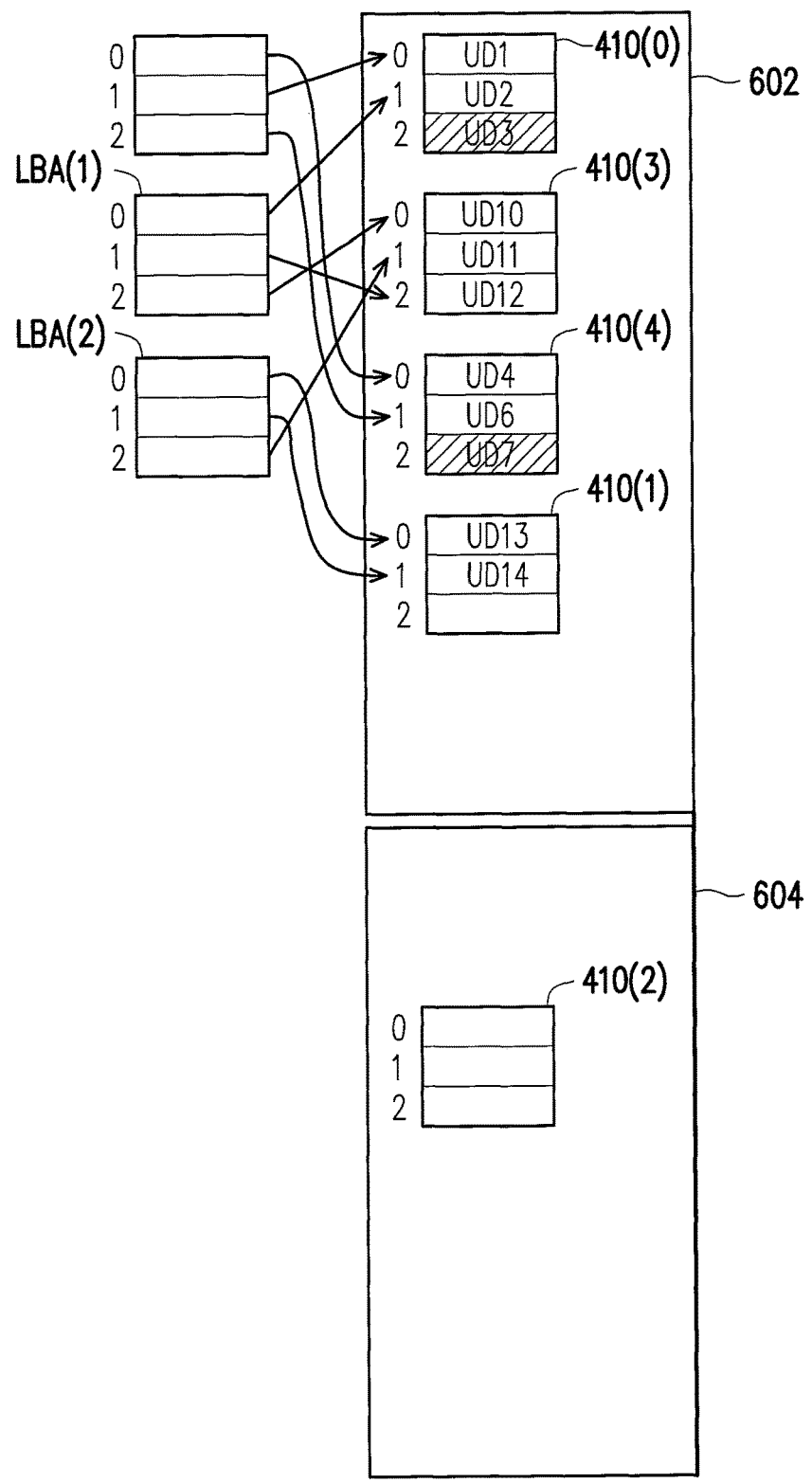

FIGS. 22 and 23 illustrate a simplified example of performing a garbage collection operation in order to complete subsequent write commands.

In continuation of FIG. 21, it is assumed that data UD13 and UD14 are to be further programmed and the data UD13 and UD14 belong to the 0-th and 1-st logical addresses of the logical block address LBA(2) respectively, but the physical erasing unit 410(3) is out of storage spaces. In this case, the memory control circuit unit 404 (or the memory management circuit 502) needs to retrieve the empty physical erasing unit from the spare area 604. However, at the time, the number of the physical erasing units of the spare area 604 is not greater than the garbage collecting threshold. Therefore, the memory control circuit unit 404 (or the memory management circuit 502) needs to perform the valid data merging operation first.

Referring to FIG. 22, for example, the memory control circuit unit 404 (or the memory management circuit 502) retrieves the physical erasing unit 410(4) from the spare area 604, and copies the valid data (i.e., the data UD4 and UD6) in the physical erasing unit 410(1) and the valid data (i.e., the data UD7) in the physical erasing unit 410(2) to the physical erasing unit 410(4). Further, the memory control circuit unit 404 (or the memory management circuit 502) maps the 0-th logical address of the logical block address LBA(0) to the 0-th physical programming unit of the physical erasing unit 410(4), maps the 2-nd logical address of the logical block address LBA(0) to the 1-st physical programming unit of the physical erasing unit 410(4), and maps the 0-th logical address of the logical block address LBA(2) to the 2-nd physical programming unit of the physical erasing unit 410(4) in the logical-physical mapping table. In addition, the memory control circuit unit 404 (or the memory management circuit 502) performs physical erasing operations on the physical erasing unit 410(1) and the physical erasing unit 410(2), clears the valid data counts of the physical erasing unit 410(1) and the physical erasing unit 410(2) in the valid data count table and associates the erased physical erasing units back with the spare area 604. At the time, the number of the physical erasing units of the spare area 604 restores back to 2 (which is greater than the garbage collection threshold).

Referring to FIG. 23, thereafter, the memory control circuit unit 404 (or the memory management circuit 502) retrieves the physical erasing unit 410(1) from the spare area 604, and gives program commands to write the data UD13 and the data UD14 into the 0-th and 1-st physical programming units of the physical erasing unit 410(1). Further, the memory control circuit unit 404 (or the memory management circuit 502) maps the 0-th logical address of the logical block address LBA(2) to the 0-th physical programming unit of the physical erasing unit 410(1) and maps the 1-st logical address of the logical block address LBA(2) to the 1-st physical programming unit of the physical erasing unit 410(1) in the logical-physical mapping table (i.e., the physical erasing unit 410(1) is associated with data area 602), and then updates the valid data count corresponding to the physical erasing unit 410(1) as 2 in the valid data count table. Specifically, the data of the 2-nd physical programming unit of the physical erasing unit 410(4) originally mapped to the 0-th logical address of the logical block address LBA(2) and the data of the 2-nd physical programming unit of the physical erasing unit 410(0) originally mapped to the 1-st logical address of the logical block address LBA(2) have now become the invalid data (as marked by slash lines). Therefore, the memory control circuit unit 404 (or the memory management circuit 502) updates the valid data count corresponding to the physical erasing unit 410(0) as 2 and updates the valid data count corresponding to the physical erasing unit 410(1) as 2 in the valid data count table.

It is worth mentioning that, in the present exemplary embodiment, the memory control circuit unit 404 (or the memory management circuit 502) determines whether a trim command is received from the host system 11. Herein, the trim commands refers a command for informing of the logical addresses in which the data is no longer used or is deleted. For example, the trim command may also be referred to as a delete command, a remove command or other commands having similar functions. Particularly, when determining that the trim command is received, the memory control circuit unit 404 (or the memory management circuit 502) records information related to the trim command (e.g., the logical addresses in which the data is deleted) in a trim table, and transmits an acknowledgement message to the host system 11 in response to the trim command, so as to rapidly respond to the host system 11 to avoid delay or time out.

Figure 24:
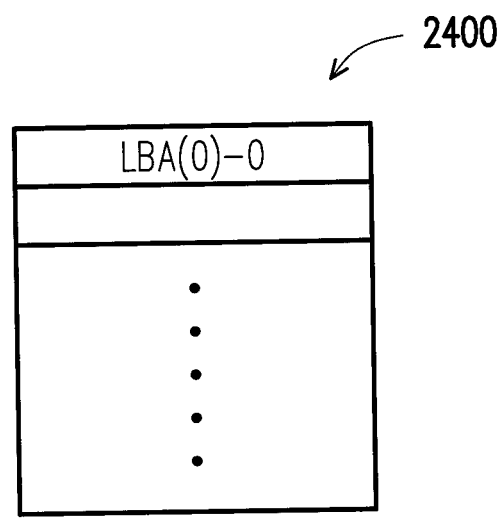
FIG. 24 is a schematic diagram illustrating a trim table according to an exemplary embodiment.

FIG. 24 is a schematic diagram illustrating a trim table according to an exemplary embodiment.

Referring to FIG. 24, it is assumed that the memory storage apparatus 10 receives a trim command and the trim command indicates that the data of the 0-th logical address of the logical block address LBA(0) is deleted under a state of FIG. 23. Accordingly, the memory control circuit unit 404 (or the memory management circuit 502) records the 0-th logical address of the logical block address LBA(0) (e.g., LBA(0)-0) in a trim table 2400. Particularly, after recording information of the trim command in the trim table 2400, the memory control circuit unit 404 (or the memory management circuit 502) transmits an acknowledgement message (which indicates that the trim command has been processed) to the host system 11.

Thereafter, the memory control circuit unit 404 (or the memory management circuit 502) may start a trim operation to perform an operation corresponding to the trim command recorded in the trim table at the proper timing. For example, the memory control circuit unit 404 (or the memory management circuit 502) starts the trim command to change a mapping of the indicated logical address to a null value in the logical-physical mapping table and/or update the valid data count of the physical erasing unit to which the physical programming unit originally mapped to the indicated logical address belongs (e.g., minus 1) according to the logical address indicated by the trim command, so as to indicate that the physical programming unit originally mapped to the indicated logical address no longer includes the valid data.

Figure 25:
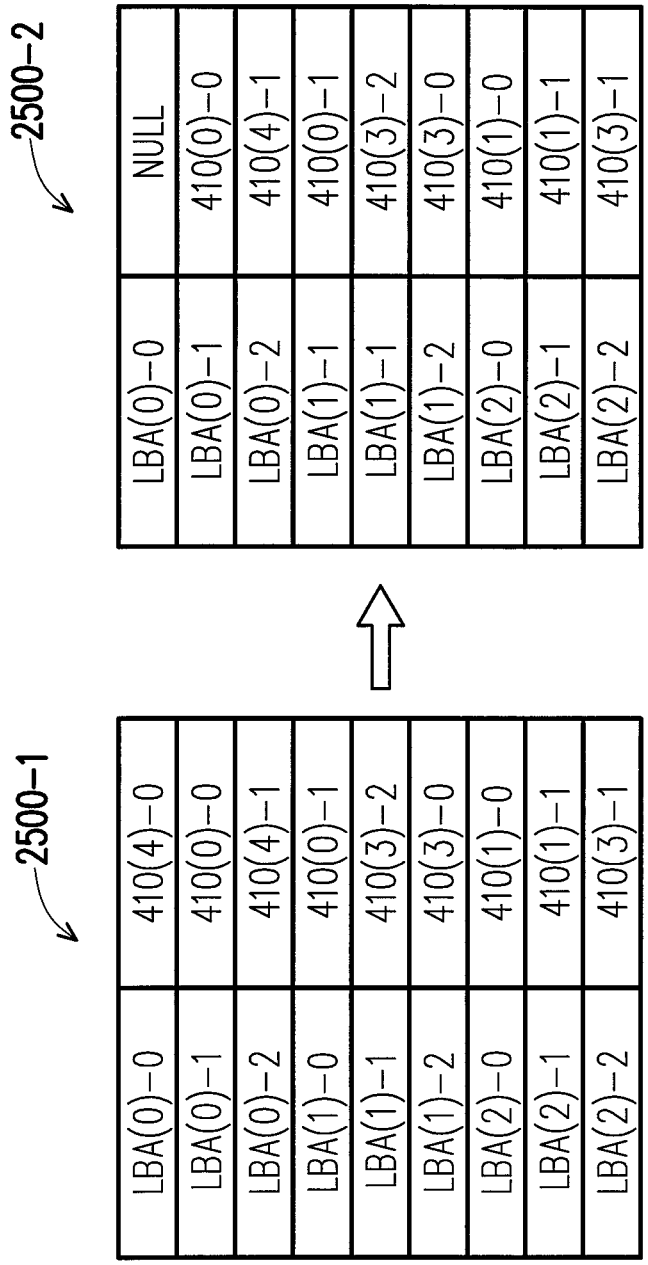
FIG. 25 and FIG. 26 are schematic diagrams illustrating a logical-physical mapping table and a valid data count table respectively before and after the trim operation is performed according to an exemplary embodiment.
Figure 26:
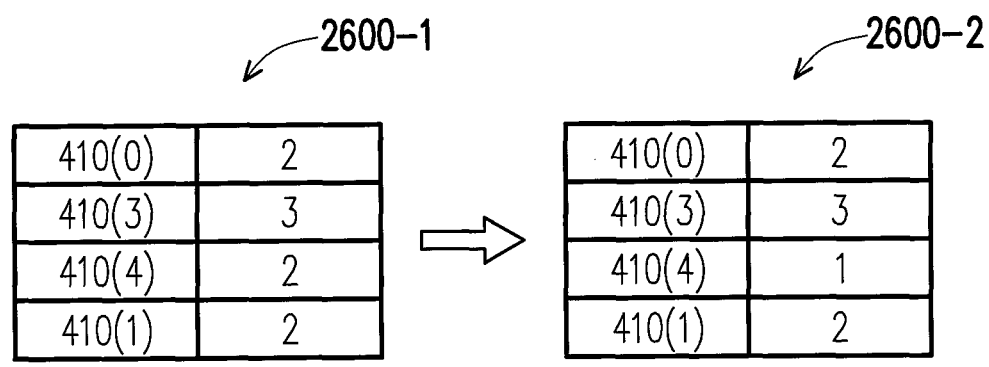

FIG. 25 and FIG. 26 are schematic diagrams illustrating a logical-physical mapping table and a valid data count table respectively before and after the trim operation is performed according to an exemplary embodiment of the invention.

Referring to FIG. 25, a logical-physical mapping table 2500-1 records the mapping relations between the logical addresses and the physical addresses according to the state of FIG. 23, where a left column records the reference numbers of the logical addresses, and a right column records the reference numbers of the physical programming units.

A logical-physical mapping table 2500-2 records the mapping relations between the logical addresses and the physical addresses after the trim operation is started to process the trim command. Specifically, the memory control circuit unit 404 (or the memory management circuit 502) changes the mapping of the 0-th logical address of the logical block address LBA(0) to a null value in the logical-physical mapping table 2500-1 according to the logical address recorded in the trim table 2400.

Referring to FIG. 26, a valid data count table 2600-1 records valid data counts of the physical erasing units in the data area 602 according to the state of FIG. 23, where a left column records the reference numbers of the physical erasing units, and a right column records values of the valid data counts.

The valid data count table 2600-2 records the valid data counts of the physical erasing units after the trim operation is started to process the trim command. Specifically, the memory control circuit unit 404 (or the memory management circuit 502) updates the valid data count of the physical erasing unit 410(4) as 1.

Subsequently, when aforesaid garbage collection operation is performed according to the logical-physical mapping table, the data in the physical programming unit not mapped to the logical address is no longer considered as the valid data and therefore moved. In addition, when the valid data count of one specific physical erasing unit becomes 0 after the data is updated or the trim operation is performed, the specific physical erasing unit may be re-associated with the spare area 604 for programming data again.

In the present exemplary embodiment, the memory control circuit unit 404 (or the memory management circuit 502) starts aforesaid trim operation in a background operation mode. For example, while performing an operation corresponding to the command from the host system 11, the memory control circuit unit 404 (or the memory management circuit 502) enters a runtime mode or a foreground execution mode. Moreover, the memory control circuit unit 404 (or the memory management circuit 502) also determines whether the command is received from the host system 11 in the runtime mode or the foreground execution mode. For example, the memory control circuit unit 404 (or the memory management circuit 502) may determine whether the write command, the read command, the trim command or the like is received from the host system 11. If the command is not received from the host system 11 within a predefined time, the memory control circuit unit 404 (or the memory management circuit 502) enters the background execution mode. The predefined time may be different based on different specifications of the memory storage apparatus, which is not particularly limited herein.

It is worth mentioning that, in the present exemplary embodiment, the memory control circuit unit 404 (or the memory management circuit 502) determines whether a command sequence is given to perform the operation corresponding to the command received from the host system 11 on the rewritable non-volatile memory module 406 with a first mode or a second mode in the foreground execution mode or the runtime mode. If a command sequence (hereinafter, also referred to as a first command sequence) is given to perform the operation corresponding to the command received from the host system 11 on the rewritable non-volatile memory module 406 with the first mode, the memory control circuit unit 404 (or the memory management circuit 502) further starts the aforesaid trim operation to process the trim command in the trim table in addition to said corresponding operation; otherwise, if a command sequence (hereinafter, also referred to as a second command sequence) is given to perform the operations corresponding to the command received from the host system 11 on the rewritable non-volatile memory module 406 with the second mode, the memory control circuit unit 404 (or the memory management circuit 502) does not start the aforesaid trim operation.

For example, in an exemplary embodiment, the first mode refers to an operation of programming data into the rewritable non-volatile memory module 406 by using a low speed mode, whereas the second mode refers an operation of programming data into the rewritable non-volatile memory module 406 by using a high speed mode.

For example, the low speed mode is aforesaid multiple page programming mode (i.e., the MLC programming mode, the TLC programming mode or other similar modes). For example, the high speed is aforesaid single page programming mode (i.e., the SLC programming mode, the lower physical programming mode, the mixture programming mode or the less level cell programming mode).

It is worth mentioning that, in the foreground execution mode or the runtime mode, other than using whether the operation of programming data with the high speed mode or the operation of programming data with the low speed mode as a reference of determining whether to start the trim operation, the memory control circuit unit 404 (or the memory management circuit 502) may also determine whether a specific operation is present as the same reference in another exemplary embodiment. For example, when it is required to perform the garbage collection operation in the foreground execution mode or the runtime mode, the memory control circuit unit 404 (or the memory management circuit 502) may determine that the operation corresponding to the command received from the host system 11 is performed on the rewritable non-volatile memory module 406 with the first mode, so that aforesaid trim operation is performed altogether. Conversely, when the operation performed in the foreground execution mode or the runtime mode does not include the garbage collection operation (i.e., when it is not required to perform the garbage collection operation), the memory control circuit unit 404 (or the memory management circuit 502) may determine that the operation corresponding to the command received from the host system 11 is performed on the rewritable non-volatile memory module 406 with the second mode, so that aforesaid trim operation is not performed. As another example, when the operation performed in the foreground execution mode or the runtime mode includes aforesaid mapping table swapping operation (i.e., when it is required to perform the mapping table swapping operation), the memory control circuit unit 404 (or the memory management circuit 502) may determine that the operation corresponding to the command received from the host system 11 is performed on the rewritable non-volatile memory module 406 with the first mode, so that perform aforesaid trim operation is performed altogether. Conversely, in the foreground execution mode or the runtime mode (when the command given by the host system 11 is performed), when the performed operation does not include aforesaid mapping table swapping operation, the memory control circuit unit 404 (or the memory management circuit 502) may determine that the operation corresponding to the command received from the host system 11 is performed on the rewritable non-volatile memory module 406 with the second mode, so that aforesaid trim operation is not performed.

Figure 27:
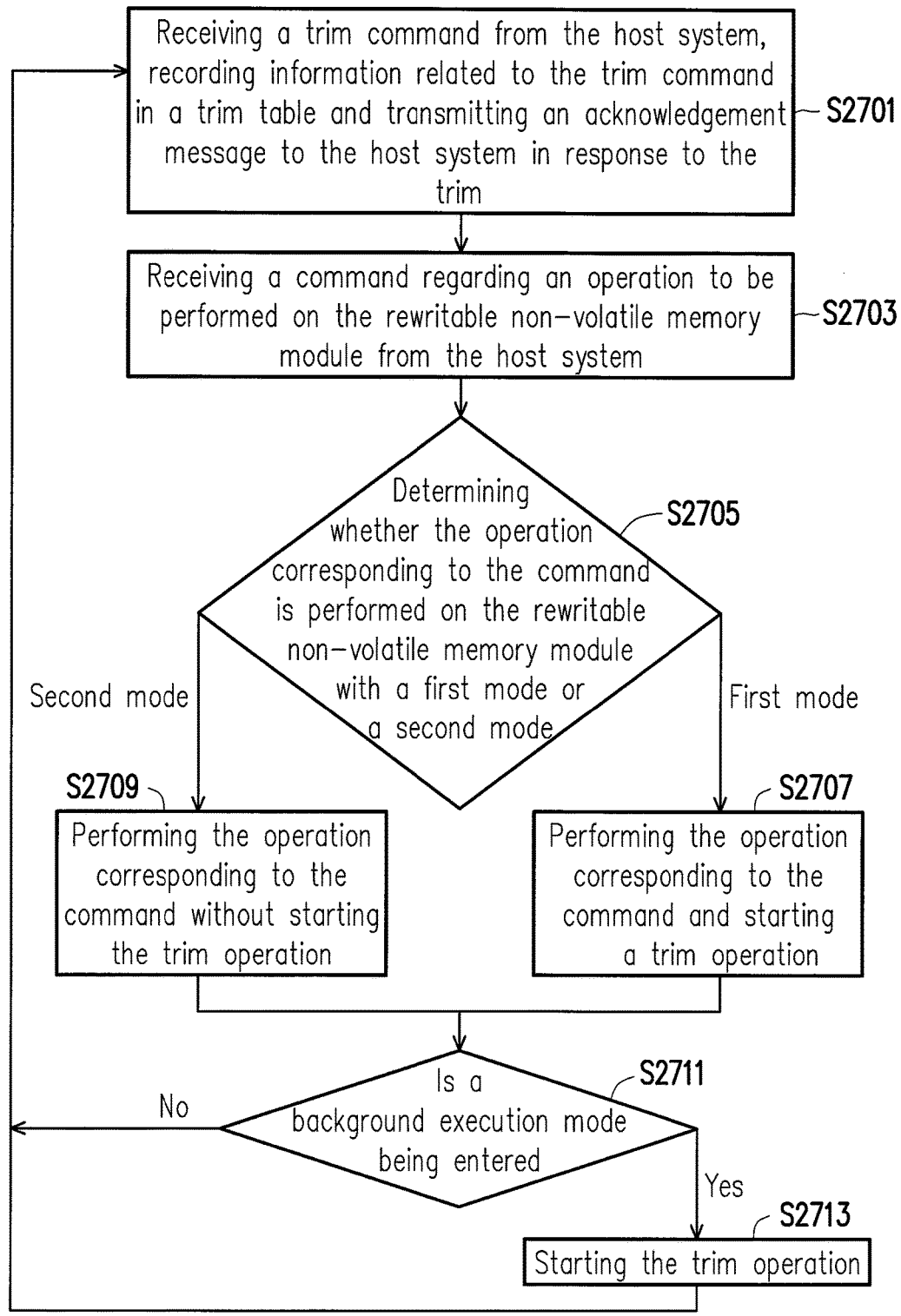
FIG. 27 is a flowchart illustrating a trim command processing method according to an exemplary embodiment.

FIG. 27 is a flowchart illustrating a trim command processing method according to an exemplary embodiment.

Referring to FIG. 27, in step S2701, the memory control circuit unit 404 (or the memory management circuit 502) receives a trim command from the host system 11, records information related to the trim command in a trim table and transmits an acknowledgement message to the host system 11 in response to the trim command. The method for recording the information related to the trim command in the trim table has been described above, which is not repeated hereinafter.

In step S2703, the memory control circuit unit 404 (or the memory management circuit 502) receives a command regarding an operation to be performed on the rewritable non-volatile memory module 406 from the host system 11.

In step S2705, the memory control circuit unit 404 (or the memory management circuit 502) determines whether the operation corresponding to the command is performed on the rewritable non-volatile memory module 406 with a first mode or a second mode.

If the operation corresponding to the command is performed on the rewritable non-volatile memory module 406 with the first mode, in step S2707, the memory control circuit unit 404 (or the memory management circuit 502) performs the operation corresponding to the command and starts aforesaid trim operation. For example, the memory control circuit unit 404 (or the memory management circuit 502) programs data into the rewritable non-volatile memory module 406 with a low speed mode, and starts the trim operation as illustrated in FIG. 25 and FIG. 26 (i.e., updating the logical-physical mapping table and/or the valid data count table according to the logical address in the trim table).

If it is determined that the operation corresponding to the command is performed on the rewritable non-volatile memory module 406 with the second mode, in step S2709, the memory control circuit unit 404 (or the memory management circuit 502) performs the operation corresponding to the command without starting aforesaid trim operation. For example, the memory control circuit unit 404 (or the memory management circuit 502) programs data into the rewritable non-volatile memory module 406 with a high speed mode but does not start the trim operation.

In step S2711, the memory control circuit unit 404 (or the memory management circuit 502) determines whether the memory storage apparatus 10 is in a background execution mode. As described above, for example, in a foreground execution mode (also known as a runtime mode), if a write command or a read command is not received within a predefined time, the memory control circuit unit 404 (or the memory management circuit 502) enters the background execution mode.

If the memory storage apparatus 10 is in the background execution mode, in step S2713, the memory control circuit unit 404 (or the memory management circuit 502) starts the trim operation to perform an operation corresponding to a trim command according to a record related to the trim command in the trim table.

It should be understood that the flowchart of FIG. 27 is merely an example in the present specification, in which steps and sequence thereof are not intended to limit the invention.

In summary, the trim command processing method, the memory control circuit unit and the memory storage apparatus according to the exemplary embodiments of the invention are capable of effectively performing the corresponding operation of the trim command, so as to improve performance of the memory storage apparatus and extend life time of the rewritable non-volatile memory module.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A trim command processing method for a memory storage apparatus, the memory storage apparatus having a rewritable non-volatile memory module, the rewritable non-volatile memory module comprising a plurality of physical programming units, the trim command processing method comprising:
   receiving a command from a host system;
   determining at least one operation of the command as being performed on the rewritable non-volatile memory module with a first mode if the at least one operation corresponding to the command includes a garbage collection operation or a mapping table swapping operation;
   determining the at least one operation of the command as being performed on the rewritable non-volatile memory module with a second mode if the at least one operation corresponding to the command does not include the garbage collection operation and does not include the mapping table swapping operation;
   starting a trim operation to perform at least one operation corresponding to at least one trim command if the at least one operation corresponding to the command is performed on the rewritable non-volatile memory module with the first mode; and
   not starting the trim operation if the at least one operation corresponding to the command is performed on the rewritable non-volatile memory module with the second mode,
   wherein the first mode is a low speed mode, and the second mode is a high speed mode.

2. The trim command processing method of claim 1, further comprising:
   receiving the at least one trim command from the host system; and
   recording the record related to the at least one trim command in the trim table and transmitting at least one acknowledgement message to the host system in response to the at least one trim command.

3. The trim command processing method of claim 1, further comprising:
   determining whether the command is not received from the host system within a predefined time;
   determining the at least one operation corresponding to the command is performed on the rewritable non-volatile memory module with the first mode or the second mode if the command is received from the host system within the predefined time; and
   entering a background execution mode if the command is not received from the host system within the predefined time and starting the trim operation in the background execution mode to perform the at least one operation corresponding to the at least one trim command according to the record related to the at least one trim command in the trim table.

4. The trim command processing method of claim 1, wherein an operating time of the at least one operation corresponding to the command performed on the rewritable non-volatile memory module with the first mode is greater than an operating time of the at least one operation corresponding to the command performed on the rewritable non-volatile memory module with the second mode.

5. The trim command processing method of claim 1, wherein the command is a write command, the low speed mode is a multi level cell programming mode or a trinary level cell programming mode, and the high speed mode is a single level cell programming mode, a lower physical programming mode, a mixture programming mode or a less level cell programming mode.

6. The trim command processing method of claim 1, wherein the step of starting the trim operation to perform the at least one operation corresponding to the at least one trim command if the at least one operation corresponding to the command is performed on the rewritable non-volatile memory module with the first mode comprises:
   starting the trim operation to perform at least one operation corresponding to the at least one trim command according to a record related to the at least one trim command in a trim table if the at least one operation corresponding to the command is performed on the rewritable non-volatile memory module with the first mode.

7. The trim command processing method of claim 1, wherein the at least one trim command comprises a first trim command, the first trim command indicates that data in a first logical address is deleted, and the first logical address maps to a first physical programming unit among the physical programming units in a logical-physical mapping table,
   wherein the step of starting the trim operation to perform the at least one operation corresponding to the at least one trim command according to the record related to the at least one trim command in the trim table comprises:
   updating a mapping corresponding to the first logical address indicated by the first trim command to a null value in the logical-physical mapping table; and
   deleting information related to the first trim command in the trim table.

8. The trim command processing method of claim 7, wherein the step of starting the trim operation to perform the at least one operation corresponding to the at least one trim command according to the record related to the at least one trim command in the trim table further comprises:
   updating a valid data count of a physical erasing unit to which the first physical programming unit belongs.

9. A memory control circuit unit, comprising:
   a host interface configured to couple to a host system;
   a memory interface configured to couple to a rewritable non-volatile memory module, wherein the rewritable non-volatile memory module comprises a plurality of physical programming units; and
   a memory management circuit coupled to the host interface and the memory interface,
   wherein the memory management circuit is configured to receive a command from the host system, wherein the memory management circuit determines at least one operation of the command as being performed on the rewritable non-volatile memory module with a first mode if the at least one operation corresponding to the command includes a garbage collection operation or a mapping table swapping operation, and the memory management circuit determines the at least one operation of the command as being performed on the rewritable non-volatile memory module with a second mode if the at least one operation corresponding to the command does not include the garbage collection operation and does not include the mapping table swapping operation, wherein the memory management circuit is further configured to start a trim operation to perform at least one operation corresponding to at least one trim command if giving a first command sequence configured to perform the at least one operation corresponding to the command on the rewritable non-volatile memory module with the first mode, wherein the memory management circuit is further configured to not start the trim operation if giving a second command sequence configured to perform the at least one operation corresponding to the command on the rewritable non-volatile memory module with the second mode, wherein the first mode is a low speed mode, and the second mode is a high speed mode.

10. The memory control circuit unit of claim 9, wherein the memory management circuit is further configured to receive the at least one trim command from the host system, record the record related to the at least one trim command in the trim table and transmit at least one acknowledgement message to the host system in response to the at least one trim command.

11. The memory control circuit unit of claim 9, wherein the memory management circuit is further configured to determine whether the command is not received from the host system within a predefined time, wherein the memory management circuit determines the at least one operation corresponding to the command is performed on the rewritable non-volatile memory module with the first mode or the second mode if the command is received from the host system within the predefined time; and wherein the memory management circuit enters a background execution mode if the command is not received from the host system within the predefined time and starts the trim operation to perform the at least one operation in the background execution mode corresponding to the at least one trim command according to the record related to the at least one trim command in the trim table.

12. The memory control circuit unit of claim 9, wherein an operating time of the at least one operation corresponding to the command performed on the rewritable non-volatile memory module with the first mode is greater than an operating time of the at least one operation corresponding to the command performed on the rewritable non-volatile memory module with the second mode.

13. The memory control circuit unit of claim 9, wherein the command is a write command, the low speed mode is a multi level cell programming mode or a trinary level cell programming mode, and the high speed mode is a single level cell programming mode, a lower physical programming mode, a mixture programming mode or a less level cell programming mode.

14. The memory control circuit unit of claim 9, wherein the memory management circuit starts the trim operation to perform the at least one operation corresponding to the at least one trim command according to a record related to the at least one trim command in a trim table if giving the first command sequence configured to perform the at least one operation corresponding to the command on the rewritable non-volatile memory module with the first mode.

15. The memory control circuit unit of claim 9, wherein the at least one trim command comprises a first trim command, the first trim command indicates that data in a first logical address is deleted, and the first logical address maps to a first physical programming unit among the physical programming units in a logical-physical mapping table, wherein in the operation of starting the trim operation to perform the at least one operation corresponding to the at least one trim command according to the record related to the at least one trim command in the trim table, the memory management circuit updates a mapping corresponding to the first logical address indicated by the first trim command to a null value in the logical-physical mapping table, and deletes information related to the first trim command in the trim table.

16. The memory control circuit unit of claim 15, wherein in the operation of starting the trim operation to perform the at least one operation corresponding to the at least one trim command according to the record related to the at least one trim command in the trim table, the memory management circuit is further configured to update a valid data count of a physical erasing unit to which the first physical programming unit belongs.

17. A memory storage apparatus, comprising:

a connection interface unit configured to couple to a host system;

a rewritable non-volatile memory module having a plurality of physical programming units; and a memory control circuit unit coupled to the connection interface unit and the rewritable non-volatile memory module, wherein the memory control circuit unit is configured to receive a command from the host system, wherein the memory control circuit unit determines at least one operation of the command as being performed on the rewritable non-volatile memory module with a first mode if the at least one operation corresponding to the command includes a garbage collection operation or a mapping table swapping operation, and the memory control circuit unit determines the at least one operation of the command as being performed on the rewritable non-volatile memory module with a second mode if the at least one operation corresponding to the command does not include the garbage collection operation and does not include the mapping table swapping operation, wherein the memory control circuit unit is further configured to start a trim operation to perform at least one operation corresponding to at least one trim command if giving a first command sequence configured to perform at least one operation corresponding to the command on the rewritable non-volatile memory module with the first mode, wherein the memory control circuit unit is further configured to not start the trim operation if giving a second command sequence configured to perform the at least one operation corresponding to the command on the rewritable non-volatile memory module with the second mode, wherein the first mode is a low speed mode, and the second mode is a high speed mode.

18. The memory storage apparatus of claim 17, wherein the memory control circuit unit is further configured to receive the at least one trim command from the host system, record the record related to the at least one trim command in the trim table and transmit at least one acknowledgement message to the host system in response to the at least one trim command.

19. The memory storage apparatus of claim 17, wherein the memory control circuit unit is further configured to determine whether the command is not received from the host system within a predefined time, wherein the memory control circuit unit determines the at least one operation corresponding to the command is performed on the rewritable non-volatile memory module with the first mode or the second mode if the command is received from the host system within the predefined time, and the memory control circuit unit enters a background execution mode if the command is not received from the host system within the predefined time and starts the trim operation to perform the at least one operation in the background execution mode corresponding to the at least one trim command according to the record related to the at least one trim command in the trim table.

20. The memory storage apparatus of claim 17, wherein an operating time of the at least one operation corresponding to the command performed on the rewritable non-volatile memory module with the first mode is greater than an operating time of the at least one operation corresponding to the command performed on the rewritable non-volatile memory module with the second mode.

21. The memory storage apparatus of claim 17, wherein the command is a write command, the low speed mode is a multi level cell programming mode or a trinary level cell programming mode, and the high speed mode is a single level cell programming mode, a lower physical programming mode, a mixture programming mode or a less level cell programming mode.

22. The memory storage apparatus of claim 17, wherein the memory control circuit unit starts the trim operation to perform the at least one operation corresponding to the at least one trim command according to a record related to the at least one trim command in a trim table if giving the first command sequence configured to perform at least one operation corresponding to the command on the rewritable non-volatile memory module with the first mode.

23. The memory storage apparatus of claim 17, wherein the at least one trim command comprises a first trim command, the first trim command indicates that data in a first logical address is deleted, and the first logical address maps to a first physical programming unit among the physical programming units in a logical-physical mapping table, wherein in the operation of starting the trim operation to perform the at least one operation corresponding to the at least one trim command according to the record related to the at least one trim command in the trim table, the memory control circuit unit updates a mapping corresponding to the first logical address indicated by the first trim command to a null value in the logical-physical mapping table, and deletes information related to the first trim command in the trim table.

24. The memory storage apparatus of claim 23, wherein in the operation of starting the trim operation to perform the at least one operation corresponding to the at least one trim command according to the record related to the at least one trim command in the trim table, the memory control circuit unit is further configured to update a valid data count of a physical erasing unit to which the first physical programming unit belongs.

* * * * *